(12) United States Patent
Yoneda et al.

(10) Patent No.: US 10,903,098 B2
(45) Date of Patent: Jan. 26, 2021

(54) SUBSTRATE PROCESSING SYSTEM AND SUBSTRATE PROCESSING APPARATUS

(71) Applicant: KOKUSAI ELECTRIC CORPORATION, Tokyo (JP)

(72) Inventors: Akihiko Yoneda, Toyama (JP); Kazuhide Asai, Toyama (JP); Tetsuyuki Maeda, Toyama (JP); Naoya Miyashita, Toyama (JP); Nobuyuki Miyakawa, Toyama (JP); Tadashi Okazaki, Toyama (JP); Hideo Yanase, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/526,712

(22) Filed: Jul. 30, 2019

(65) Prior Publication Data
US 2020/0043763 A1 Feb. 6, 2020

(30) Foreign Application Priority Data

Aug. 3, 2018 (JP) ................................ 2018-146484
Jul. 8, 2019 (JP) ................................ 2019-127050

(51) Int. Cl.
*H01L 21/00* (2006.01)
*H01L 21/67* (2006.01)
(Continued)

(52) U.S. Cl.
CPC ...... *H01L 21/67253* (2013.01); *G05B 19/409* (2013.01); *H01L 21/67288* (2013.01);
(Continued)

(58) Field of Classification Search
CPC ................... H01L 21/67253; H01L 21/67742
See application file for complete search history.

(56) References Cited

U.S. PATENT DOCUMENTS

2003/0157736 A1 8/2003 Matsushita
2010/0152887 A1 6/2010 Kawasaki
(Continued)

FOREIGN PATENT DOCUMENTS

JP 2002-238029 A 8/2002
JP 2003-197495 A 7/2003
(Continued)

OTHER PUBLICATIONS

Japanese Office Action dated Aug. 18, 2020 for Japanese Patent Application No. 2019-127050.

*Primary Examiner* — Caridad Everhart
*Assistant Examiner* — Ankush K Singal
(74) *Attorney, Agent, or Firm* — Volpe Koenig

(57) ABSTRACT

There is provided a technique that includes a first controller configured to acquire event data generated at a time of transferring a substrate and alarm data generated at a time of occurrence of a transfer error, a recorder configured to, while recording a transfer operation of the substrate as first image data, record the transfer operation of the substrate as second image data having a higher resolution than the first image data, a second controller configured to store the first image data in a first memory based on the event data, and store the second image data in a second memory based on the alarm data, and an operating controller configured to display at least the first image data and the second image data. The second controller displays both the first image data and the second image data on a same screen.

14 Claims, 22 Drawing Sheets

(51) Int. Cl.
*H01L 21/677* (2006.01)
*G05B 19/409* (2006.01)

(52) U.S. Cl.
CPC .. *H01L 21/67742* (2013.01); *H01L 21/67757* (2013.01); *G05B 2219/35312* (2013.01)

(56) References Cited

U.S. PATENT DOCUMENTS

| | | |
|---|---|---|
| 2011/0160900 A1 | 6/2011 | Morita |
| 2014/0176701 A1* | 6/2014 | Okuno .............. H01L 21/67742 |
| | | 348/125 |

FOREIGN PATENT DOCUMENTS

| | | |
|---|---|---|
| JP | 2005-116734 A | 4/2005 |
| JP | 2010-161346 A | 7/2010 |
| JP | 2011-155244 A | 8/2011 |
| JP | 2013-030747 A | 2/2013 |

* cited by examiner

FIG. 4
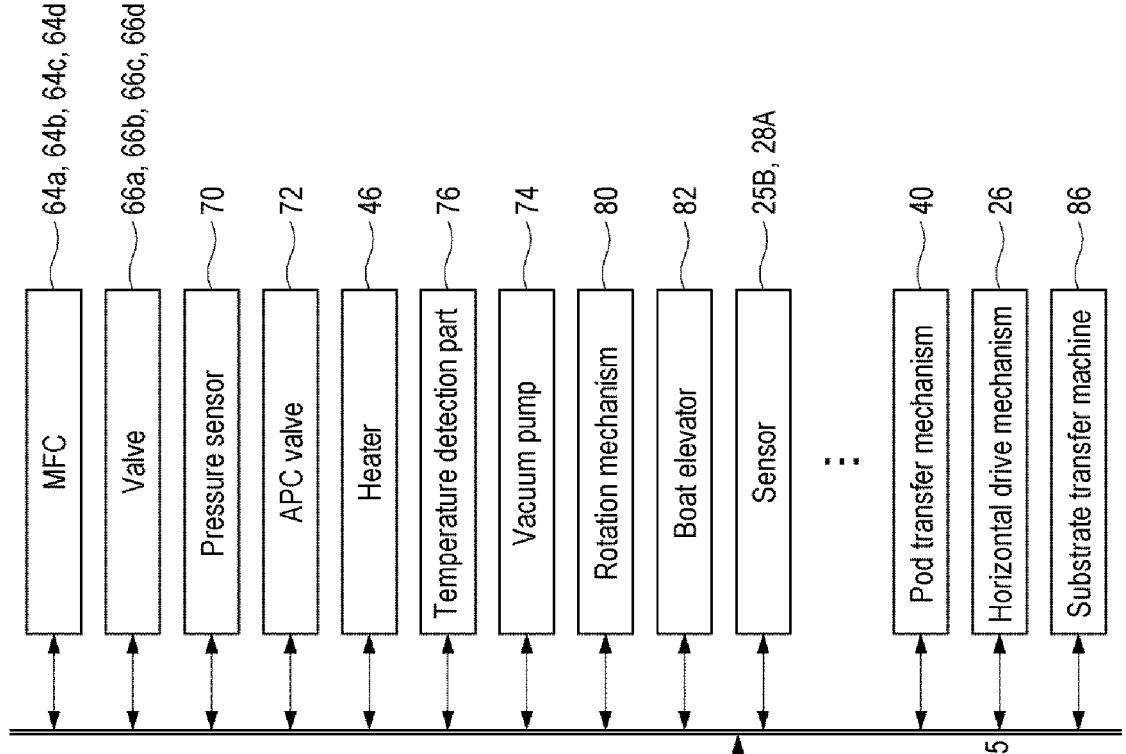
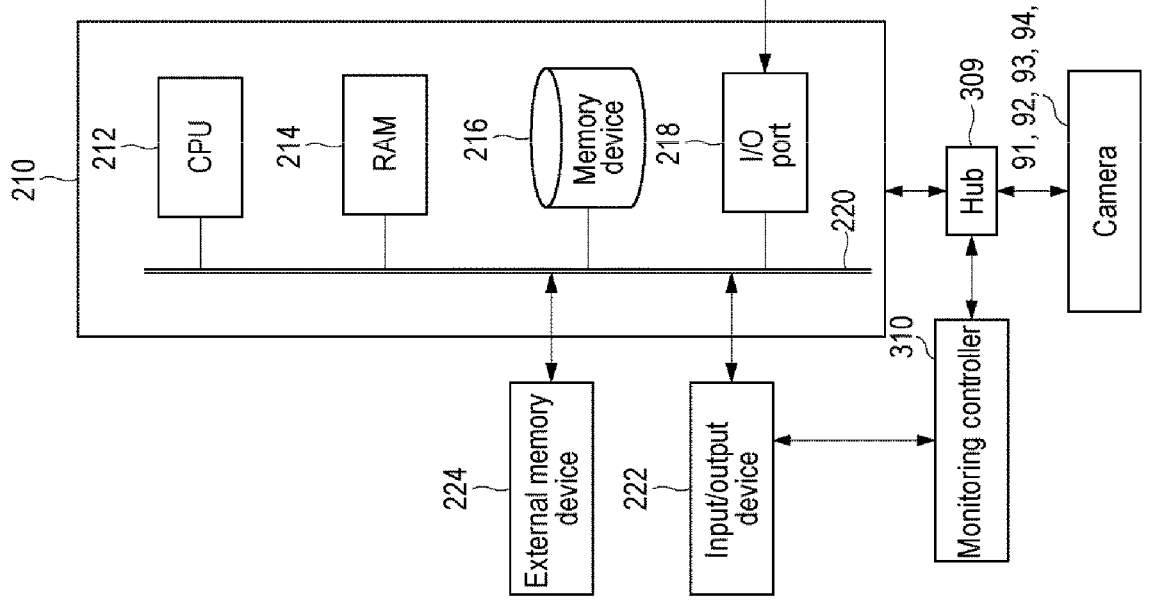

Motion image compression image

FIG. 8
MJPEG format
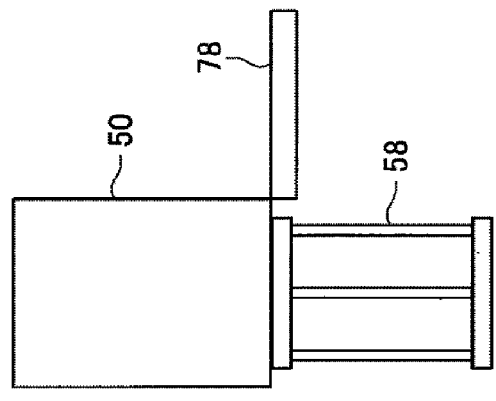
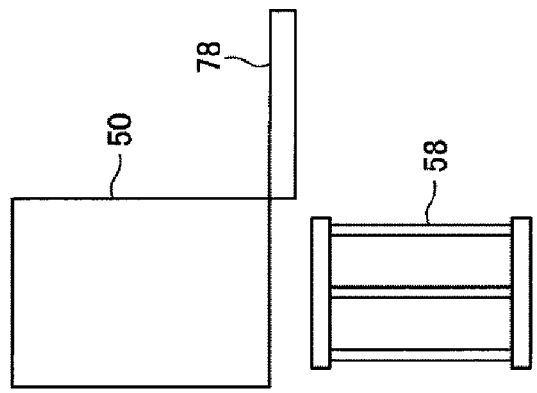
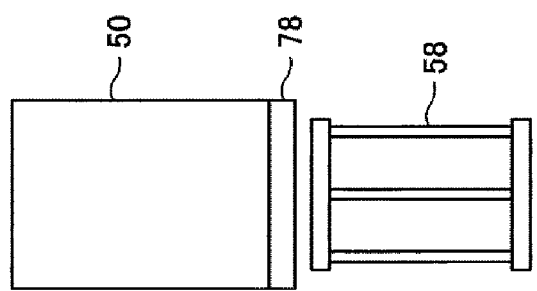

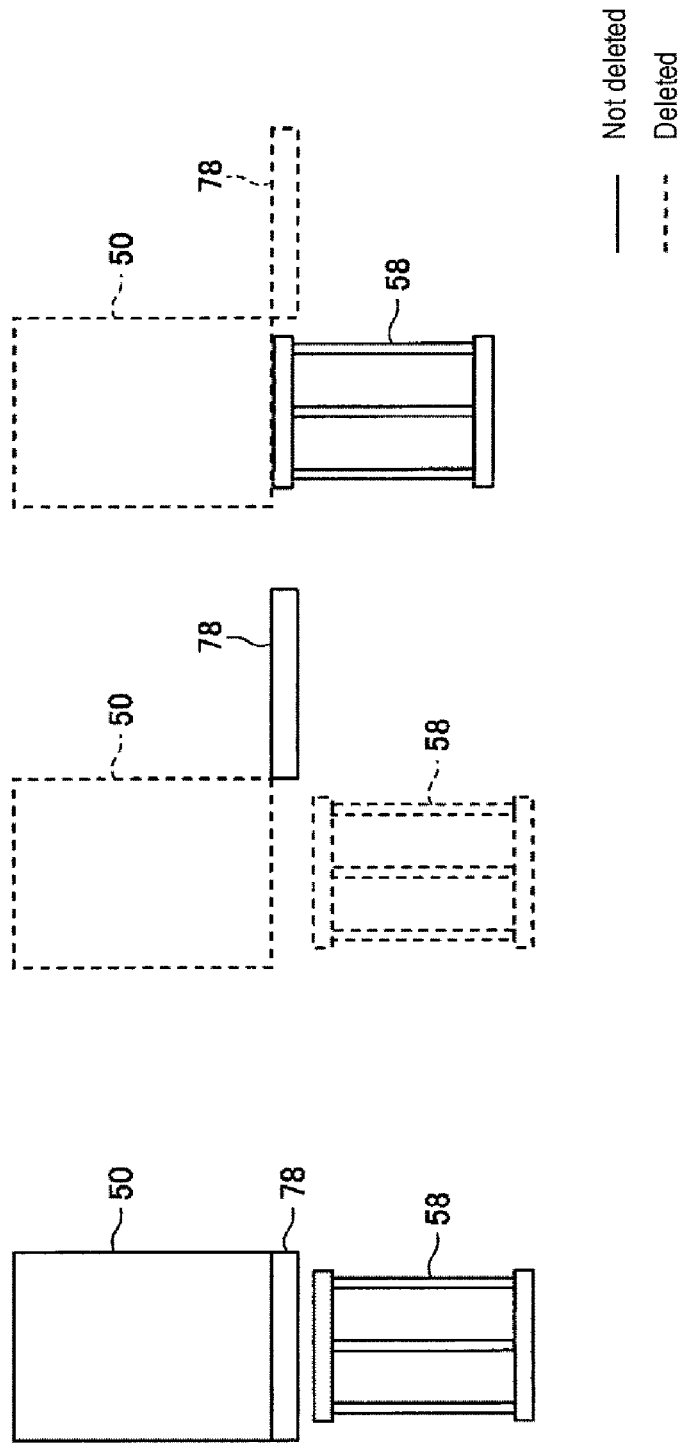

H.264 format

H.265 format

Transfer trouble.avi

| Name |
|---|
| 🖼 00030000.jpg |
| 🖼 00064000.jpg |
| 🖼 00098000.jpg |
| 🖼 00131000.jpg |
| 🖼 00165000.jpg |
| 🖼 00198000.jpg |
| 🖼 00023100.jpg |
| 🖼 00265000.jpg |
| 🖼 00297000.jpg |
| 🖼 00331000.jpg |
| 🖼 00364000.jpg |
| 🖼 00397000.jpg |
| 🖼 00431000.jpg |
| 🖼 00464000.jpg |
| 🖼 00497000.jpg |
| 🖼 00530000.jpg |
| 🖼 00564000.jpg |
| ⋮ |

0.033(1/30) second

FIG. 13

| Item | Imaging target | Motion image/ Still image | Purpose |
|---|---|---|---|
| ① During OHT carrier loading ⑨ During OHT carrier unloading | Transfer port 42 Pod transfer mechanism 40 | Motion image | Confirming pod delivery in load port Confirming operation of pod transfer mechanism |
| ② After FIMS opening | FIMS opener | Still image | Determining wafer pop-out after FIMS opening |
| ③ During charging ⑧ During discharging | Boat 58 FIMS opener Substrate transfer machine 86 | Motion image | Taking out wafer from pod Confirming charging of wafer on substrate transfer machine to boat during operation |
| ④ After charging completion ⑦ After unloading | Boat 58 | Still image | Confirming wafer on boat |
| ⑤ During boat loading ⑥ During unloading | Boat 58 | Motion image | Confirming boat and wafer during E-axis operation |

FIG. 14

| Imaging target | Alarm ID | Camera number |
|---|---|---|
| Load port for delivering pod | 50001 | 1 |
| | ⋮ | ⋮ |
| | 50999 | 1 |
| Pod transfer mechanism for transferring pod | 51000 | 2 |
| | ⋮ | ⋮ |
| | 53000 | 2 |
| FIMS opener | 53001 | 3 |
| | ⋮ | ⋮ |
| | 55000 | 3 |
| Substrate transfer machine and boat 1 | 55001 | 4 |
| | ⋮ | ⋮ |
| | 58000 | 4 |
| Substrate transfer machine and boat 2 | 58001 | 5 |
| | ⋮ | ⋮ |
| | 61000 | 5 |

SUBSTRATE PROCESSING SYSTEM AND SUBSTRATE PROCESSING APPARATUS

CROSS-REFERENCE TO RELATED APPLICATION

This application is based upon and claims the benefit of priority from Japanese Patent Application Nos. 2018-146484 and 2019-127050, filed on Aug. 3, 2018 and Jul. 8, 2019, respectively, the entire contents of which are incorporated herein by references.

TECHNICAL FIELD

The present disclosure relates to a substrate processing system and a substrate processing apparatus.

BACKGROUND

The substrate processing apparatus is configured to, for example, transfer a substrate (hereinafter also referred to as a wafer) into a process chamber by a transfer means and to perform a predetermined process on the substrate in the process chamber. At the time of transferring the substrate, for example, the substrate may be shifted, dropped or damaged due to a problem of the transfer means or a pressure difference inside and outside the process chamber.

Conventionally, it has been performed to grasp the transfer status of the transfer means. In addition, a detection means (e.g., sensors such as an optical sensor, mapping sensor, etc.) for detecting the state of the substrate is provided. When the state of the substrate at a predetermined position is different from an expected value, it is detected as a transfer error. Then, a transfer error situation and a monitor screen of a transfer system at the time of occurrence of the transfer error are displayed on an operation screen. However, even if it is known that the transfer error has occurred, it is difficult to immediately know the detailed state of the substrate such as position shift, dropping, damage or the like and the cause of the state.

In order to solve such a situation, for example, it is conceivable to install a recording means such as a video camera or the like in a substrate processing apparatus to be used for analysis of a transfer error. However, when visual image data obtained in an operation is continuously stored, it is required to select appropriate image data from a huge amount of image data at the time of occurrence of a transfer error to be displayed. Thus, time required for analysis is wasted. Hereinafter, "Visual image data" is simply referred to as "image data."

SUMMARY

Some embodiments of the present disclosure provide a configuration that performs an analysis using image data obtained at the time of substrate transfer and image data obtained at the time of transfer error occurrence.

According to some embodiments of the present disclosure, there is provided a technique that includes a first controller configured to acquire event data generated at a time of transferring a substrate and alarm data generated at a time of occurrence of a transfer error, a recorder configured to, while recording a transfer operation of the substrate as first image data, record the transfer operation of the substrate as second image data having a higher resolution than the first image data, a second controller configured to store the first image data recorded by the recorder in a first memory based on the event data, and store the second image data recorded by the recorder in a second memory based on the alarm data, and an operating controller configured to display at least the first image data and the second image data, wherein the second controller is configured to display both the first image data and the second image data recorded at the time of occurrence of the transfer error on a same screen.

BRIEF DESCRIPTION OF DRAWINGS

FIG. 4 is a schematic configuration view of a controller of the substrate processing apparatus suitably used in some embodiments of the present disclosure, in which a control system of the controller is shown in a block diagram.

FIG. 8 is a view for explaining an MJPEG format.

FIG. 9 is a view for describing an H.264 format.

FIGS. 11A and 11B are views for explaining file storage in an MJPEG format.

FIG. 13 is a diagram for explaining a recording means suitably used in some embodiments of the present disclosure.

FIG. 14 is a diagram for explaining the recording means suitably used in some embodiments of the present disclosure.

DETAILED DESCRIPTION

Figure 1:
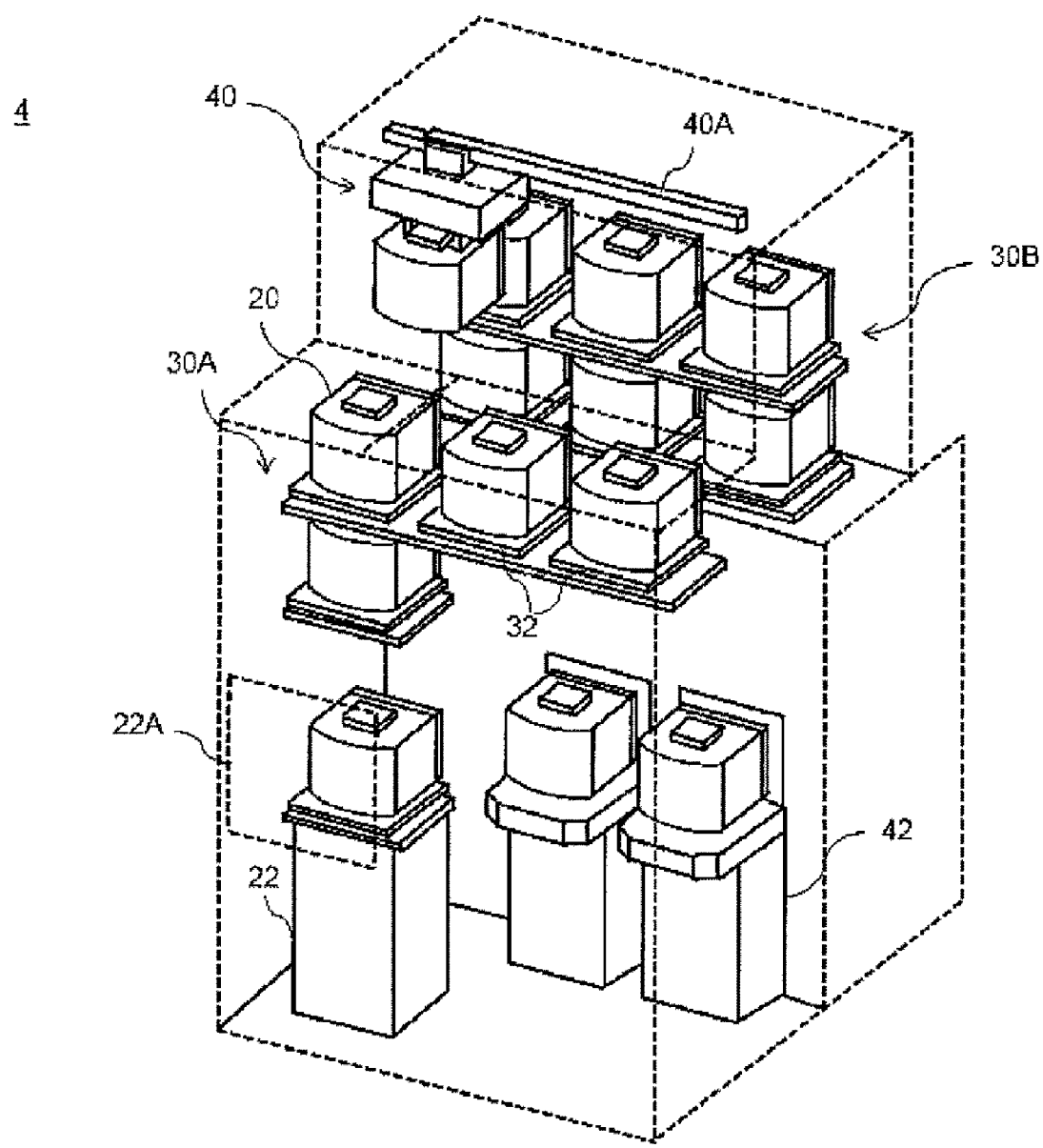
FIG. 1 is a perspective transparent view of a storage chamber suitably used in a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

Hereinafter, a first embodiment of the present disclosure will be described with reference to FIGS. 1 to 3.

(1) Configuration of Substrate Processing Apparatus

As shown in FIG. 1, in the embodiments, the substrate processing apparatus 4 is configured as a vertical heat treatment apparatus (batch-type vertical heat treatment apparatus) that carries out a heat treatment process in a method of manufacturing an IC. In the vertical heat treatment apparatus to which the present disclosure is applied, a FOUP (Front Opening Unified Pod) (hereinafter referred to as a pod) 20 is used as a carrier for transferring a wafer W as a substrate. The substrate processing apparatus 4 includes a process furnace 8, an accommodation chamber 12 and a transfer chamber 16, which will be described later.

(Accommodation Chamber)

The accommodation chamber 12 for accommodating a pod 20 loaded into the apparatus is disposed on the front side inside a housing of the substrate processing apparatus 4. A loading/unloading port 22A, which is an opening for loading/unloading the pod 20 into/from the accommodation chamber 12, is formed on the housing front side of the accommodation chamber 12 so as to communicate between the inside and outside of the housing of the accommodation chamber 12. The loading/unloading port 22A may be configured to be opened and closed by a front shutter. An AGV port (I/O stage) 22 as a load port (pod mounting device) is provided inside the housing of the loading/unloading port 22A. A transfer port 42 is installed on a wall surface between the accommodation chamber 12 and the transfer chamber 16. The pod 20 is loaded into the substrate processing apparatus 4 and mounted on the AGV port 22 by an in-process transfer device (inter-process transfer device) existing outside the substrate processing apparatus 4 and is also unloaded from the AGV port 22.

Above the AGV port 22 on the front side inside the housing of the accommodation chamber 12, storage shelves (pod shelves) 30A for storing pods 20 are installed in two upper and lower stages. On the rear side inside the housing of the accommodation chamber 12, storage shelves (pod shelves) 30B for storing pods 20 are installed in a matrix pattern.

OHT ports 32 as load ports are installed to be arranged in the left-right direction on the same straight line in the horizontal direction as the storage shelf 30A existing on the front upper stage of the housing. The pod 20 is loaded onto the OHT port 32 from above the substrate processing apparatus 4 by the in-process transfer device (inter-process transfer device) existing outside the substrate processing apparatus 4 and is also unloaded from the OHT port 32. The AGV port 22, the storage shelf 30A and the OHT port 32 are configured so that the pod 20 can be horizontally moved between a mounting position and a delivery position by a horizontal drive mechanism 26. Hereinafter, the AGV port 22 may be referred to as a first load port, and the OHT port 32 may be referred to as a second load port.

Figure 2:
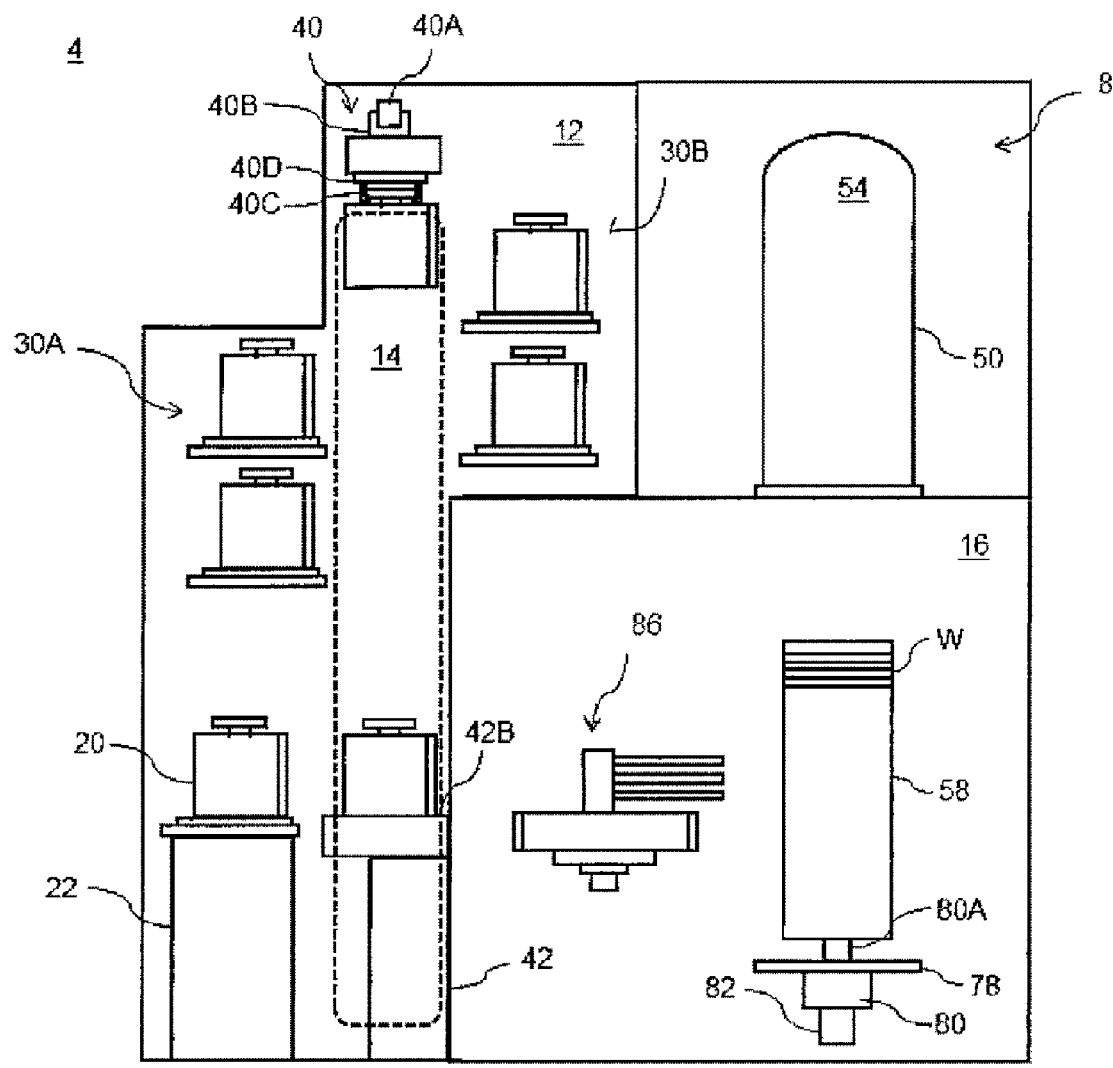
FIG. 2 is a sectional view of a substrate processing apparatus suitably used in the first embodiment of the present disclosure.
Figure 3:
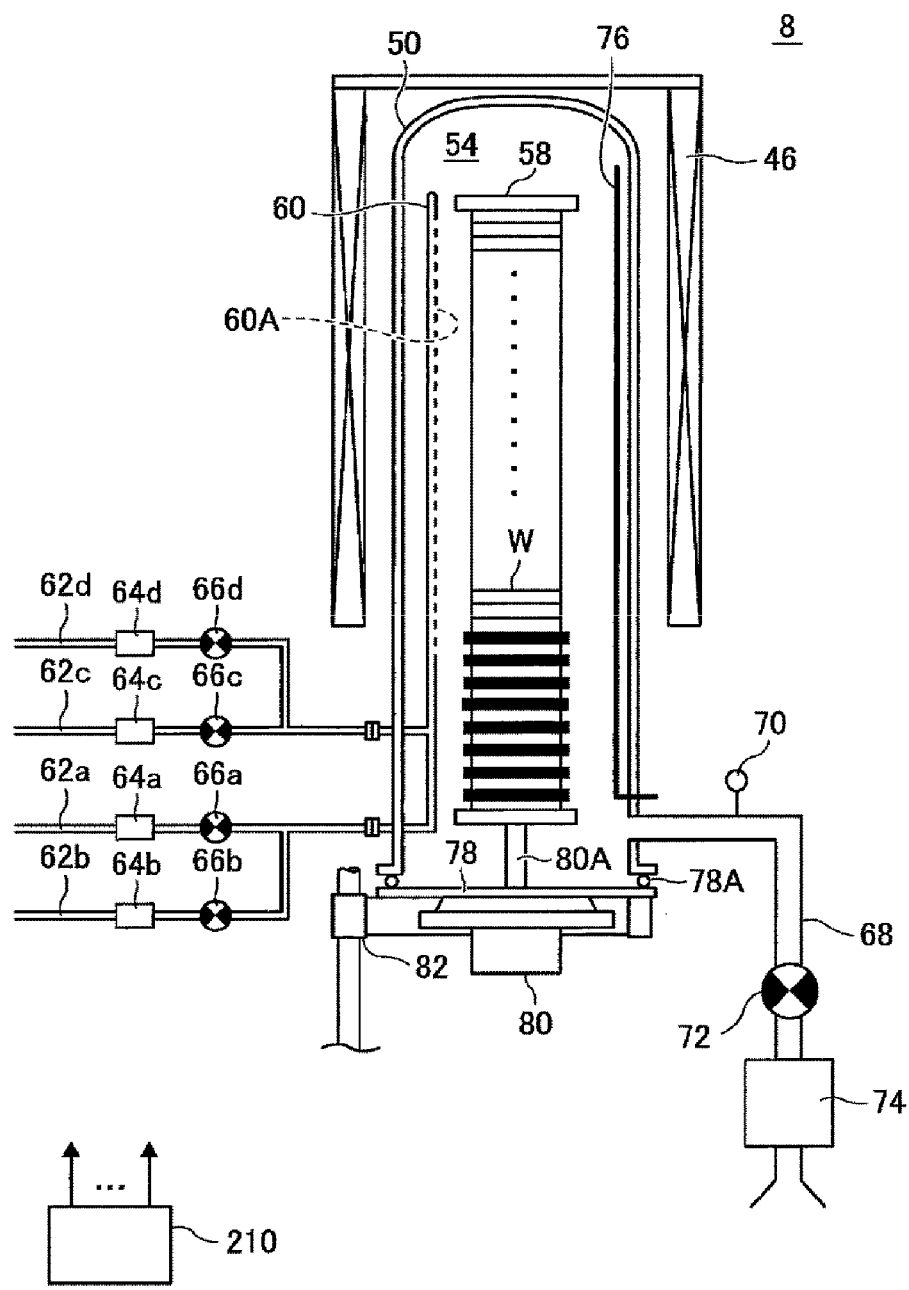
FIG. 3 is a schematic configuration view of a vertical process furnace of the substrate processing apparatus suitably used in some embodiments of the present disclosure, in which a portion of the process furnace is shown in a vertical cross section.

As shown in FIG. 2, the space between the front storage shelf 30A and the rear storage shelf 30B inside the housing of the accommodation chamber 12 forms a pod transfer region 14. Delivery and transfer of the pod 20 are performed in the pod transfer region 14. A rail mechanism 40A as a traveling path of a pod transfer mechanism 40 that is a pod transfer device is formed in the ceiling portion in the pod transfer region 14 (the ceiling portion of the accommodation chamber 12). In this regard, the delivery position is located in the pod transfer region 14 which indicates, for example, a position just below the pod transfer mechanism 40.

The pod transfer mechanism 40 for transferring the pod 20 includes a traveling part 40B configured to travel along the traveling path, a holding part 40C configured to hold the pod 24, and an elevating part 40D configured to raise and lower the holding part 40C in the vertical direction. By detecting an encoder of a motor that drives the traveling part 40B, it is possible to detect the position on the traveling path 40A and to move the traveling part 40B to an arbitrary position.

(Transfer Chamber)

A transfer chamber 16 is formed adjacent to the rear side of the accommodation chamber 12. On the side of the transfer chamber 16 in the accommodation chamber 12, a plurality of wafer loading/unloading ports for loading and unloading the wafer W into and from the transfer chamber 16 are installed to be arranged in the horizontal direction. A transfer port 42 is provided with respect to each wafer loading/unloading port. In the transfer port 42, the mounting table 42B for mounting the pod 20 thereon is moved horizontally and pressed against the wafer loading/unloading port. The lid of the pod 20 is opened by a front-opening interface standard (FIMS) opener as a lid opening/closing mechanism (lid opening/closing device). When the lid of the pod 20 is opened, the wafer W is transferred into and out of the pod 20 by a substrate transfer machine 86 as a substrate transfer device.

(Process Furnace)

A process furnace 8 is provided above the transfer chamber 16. As shown in FIG. 3, the process furnace 8 includes a heater 46 as a heating means (heating mechanism). The heater 46 has a cylindrical shape and is vertically installed by being supported by a heater base (not shown) as a holding plate. The heater 46 also functions as an activation mechanism (excitation part) that thermally activates (excites) a gas as described later.

Inside the heater 46, a reaction tube 50 that constitutes a reaction container (process container) is disposed concentrically with the heater 46. The reaction tube 50 is made of, for example, a heat resistant material such as quartz ($SiO_2$) or silicon carbide (SiC) and is formed in a cylindrical shape with the upper end thereof closed and the lower end thereof opened. A process chamber 54 is formed in the hollow portion of the reaction tube 50. The process chamber 54 is configured to be able to accommodate wafers W as substrates in a state in which the wafers W are aligned in a horizontal posture and vertically disposed in multiple stages by a boat 58 to be described later.

In the process chamber 54, a nozzle 60 is provided to penetrate the lower portion of the reaction tube 50. The nozzle 60 is made of, for example, a heat resistant material such as quartz or SiC. A gas supply pipe 62a and a gas supply pipe 62c are connected to the nozzle 60. In the gas supply pipes 62a and 62c, mass flow controllers (MFCs) 64a and 64c as flow rate controllers (flow rate control parts) and valves 66a and 66c as opening/closing valves are respectively provided sequentially from the upstream side. Gas supply pipes 62b and 62d for supplying an inert gas are connected to the gas supply pipes 62a and 62c on the downstream side of the valves 66a and 66c, respectively. In the gas supply pipes 62b and 62d, MFCs 64b and 64d and valves 66b and 66d are respectively provided sequentially from the upstream side. A process gas supply part as a process gas supply system is mainly constituted by the gas supply pipe 62a, the MFC 64a and the valve 66a. Furthermore, a reaction gas supply part as a reaction gas supply system is constituted by the gas supply pipe 62c, the MFC 64c and the valve 66c. In addition, an inert gas supply part as an inert gas supply system is constituted by the gas supply pipes 62b and 62d, the MFCs 64b and 64d, and the valves 66b and 66d.

The nozzle 60 is provided in an annular space between the inner wall of the reaction tube 50 and the wafers W so as to extend upward in the arrangement direction of the wafers W from the lower portion of the inner wall of the reaction tube 50 to the upper portion thereof. That is, the nozzle 60 is provided along a wafer arrangement area in a region horizontally surrounding the wafer arrangement area on the lateral side of the wafer arrangement area in which the wafers W are arranged. The nozzle 60 is configured as an L-shaped long nozzle. The horizontal portion of the nozzle 60 is provided to penetrate the lower side wall of the reaction tube 50, and the vertical portion of the nozzle 60 is provided to extend upward from at least one end side of the wafer arrangement area to the other end side of the wafer arrangement area. Gas supply holes 60A for supplying a gas are provided on the side surface of the nozzle 60. The gas supply holes 60A are respectively opened to face the center of the reaction tube 50 and are configured to be able to supply a gas toward the wafers W. The gas supply holes 60A are provided from the lower portion to the upper portion of the reaction tube 50. The gas supply holes 60A have the same opening area and are provided at the same opening pitch.

The reaction tube 50 is provided with an exhaust pipe 68 for exhausting the atmosphere in the process chamber 54. A vacuum pump 74 as a vacuum exhaust device is connected to the exhaust pipe 68 via a pressure sensor 70 as a pressure detector (pressure detection part) for detecting the pressure in the process chamber 54 and an APC (Auto Pressure Controller) valve 72 as a pressure regulator (pressure regulation part). The APC valve 72 is a valve capable of performing vacuum exhaust and stopping vacuum exhaust for the process chamber 54 as the APC valve 72 is opened and closed in a state in which the vacuum pump 74 is operated. Furthermore, the APC valve 72 is a valve configured to regulate the pressure in the process chamber 54 by adjusting a valve opening degree based on the pressure information detected by the pressure sensor 70 in a state in which the vacuum pump 74 is operated. An exhaust system is mainly constituted by the exhaust pipe 68, the APC valve 72 and the pressure sensor 70. The vacuum pump 74 may be included in the exhaust system.

The reaction tube 50 is provided with a temperature detection part 76 as a temperature detector. By adjusting the amount of electric power supplied to the heater 46 based on the temperature information detected by the temperature detection part 76, the process chamber 54 has a desired temperature distribution. The temperature detection part 76 is configured in an L-shape just like the nozzle 60 and is provided along the inner wall of the reaction tube 50.

Below the reaction tube 50, there is provided a seal cap 78 as a furnace port cover capable of airtightly closing the lower end opening of the reaction tube 50. The seal cap 78 is a member of a disc shape, which is made of, for example, metal such as SUS or stainless steel. On the upper surface of the seal cap 78, there is provided an O-ring 78A as a seal member that makes contact with the lower end of the reaction tube 50. In addition, a seal cap plate 78B for protecting the seal cap 78 is installed in an inner region than the O-ring 78A on the upper surface of the seal cap 78. The seal cap plate 78B is a member of a disc shape, which is made of, for example, a heat resistant material such as quartz or SiC. The seal cap 78 is configured to make contact with the lower end of the reaction tube 50 from the lower side in the vertical direction.

A boat 58 as a substrate support (substrate support device) is configured to support a plurality of wafers W, for example, 25 to 200 wafers W, in a horizontal posture, in multiple stages and in a vertically aligned state with the centers thereof aligned with each other, i.e., to arrange the wafers W in a spaced-apart relationship. The boat 58 is made of, for example, a heat resistant material such as quartz or SiC.

On the opposite side of the seal cap 78 from the process chamber 54, there is installed a rotation mechanism 80 as a boat rotation device for rotating the boat 58. A rotation shaft 80A of the rotation mechanism 80 is connected to the boat 58 by penetrating the seal cap 78. The rotation mechanism 80 is configured to rotate the wafer W by rotating the boat 58.

As shown in FIG. 4, an apparatus controller (first control means) 210 as a control part (control means) is configured as a computer that includes a central processing unit (CPU) 212, a random access memory (RAM) 214, a memory device 216 and an I/O port 218. The RAM 214, the memory device 216 and the I/O port 218 are configured to be able to exchange data with the CPU 212 via an internal bus 220. An input/output device 222 configured as, for example, a touch panel or the like is connected to the apparatus controller 210. Furthermore, a monitoring controller 310 as a second control means and imaging devices (hereinafter referred to as cameras) 91, 92, 93, 94 and 95 (hereinafter abbreviated as 91 to 95) as recording means are connected to the apparatus controller 210 via a hub 309. The details of the cameras 91 to 95 will be described later.

The memory device 216 is configured by, for example, a flash memory, a hard disk drive (HDD), or the like. The memory device 216 readably stores a control program for controlling the operation of the substrate processing apparatus, a process recipe in which the procedure and conditions of a substrate processing process described later are written, and the like. The process recipe is combined so as to cause the apparatus controller 210 to execute each procedure in the below-described substrate processing process to obtain a predetermined result. The process recipe functions as a program. Hereinafter, the process recipe, the control program and the like are collectively and simply referred to as a program. When the term "program" is used in the subject specification, it may refer to a case of including only the process recipe, a case of including only the control program, or a case of including both the process recipe and the control program. The RAM 214 is configured as a memory area (work area) in which programs and data read by the CPU 212 are temporarily held.

The I/O port 218 is connected to the MFCs 64a, 64b, 64c and 64d, the valves 66a, 66b, 66c and 66d, the pressure sensor 70, the APC valve 72, the heater 46, the temperature detection part 76, the vacuum pump 74, the rotation mechanism 80, the boat elevator 82 as a boat elevating device, the pod transfer mechanism 40, the sensors (detectors) 25B and 28A, the horizontal drive mechanism 26, and the like.

The CPU 212 is configured to read the control program from the memory device 216 and execute the control program thus read, and is configured to read the process recipe from the memory device 216 in response to the input of an operation command from the input/output device 222. The CPU 212 is configured to, according to the contents of the process recipe thus read, control the flow rate adjustment operation of various gases by the MFC 64a, 64b, 64c and 64d, the opening/closing operation of the valves 66a, 66b, 66c and 66d, the opening/closing operation of the APC valve 72, the pressure regulation operation by the APC valve 72 based on the pressure sensor 70, the start and stop of the vacuum pump 74, the temperature adjustment operation of the heater 46 based on the temperature detection part 76, the rotation and rotation speed adjustment operation of the boat 58 by the rotation mechanism 80, the elevating operation of the boat 58 by the boat elevator 82, the pod transfer operation by the pod transfer mechanism 40, the driving operation of the horizontal drive mechanism 26 based on the sensors 25B and 28A, the substrate transfer operation by the substrate transfer machine 86 with respect to the boat 58, and the like.

The apparatus controller 210 may be configured by installing the above-described program stored in an external memory device (e.g., a magnetic tape, a magnetic disk such as a flexible disk or a hard disk, an optical disk such as a CD or a DVD, a magneto-optical disk such as an MO or the like, or a semiconductor memory such as a USB memory or a memory card) 224, in a computer. The memory device 216 or the external memory device 224 is configured as a non-transitory computer-readable recording medium. Hereinafter, the memory device 216 and the external memory device 224 will be generally and simply referred to as a "recording medium." When the term "recording medium" is used in the subject specification, it may indicate a case of including only the memory device 216, a case of including only the external memory device 224, or a case of including both the memory device 216 and the external memory device 224. The program may be supplied to a computer by using a communication means such as the Internet or a dedicated line without going through the external memory device 224.

Next, the transfer of the pod 20 using the above-described substrate processing apparatus 4 will be described.
(Carrier Loading Step: S10)

When the pod 20 is supplied to the AGV port 22 or the OHT port 32, the pod 20 on the AGV port 22 or the OHT port 32 is loaded into the substrate processing apparatus 4. The pod 20 thus loaded is automatically transferred and delivered by the pod transfer mechanism 40 to the designated stage 25 of the storage shelf 30 and is temporarily stored. Thereafter, the pod 20 is transferred and delivered from the storage shelf 30 to one of the transfer ports 42. Also, the pod 20 may be directly transferred to one of the transfer ports 42.

The traveling part 40B is controlled to move the pod transfer mechanism 40 to above the delivery position of the stage 25 of the AGV port 22 on which the pod 20 to be transferred is mounted. As used herein, the language "above the delivery position" refers to a position at which the pod transfer mechanism 40 can lower the holding part 40C by the elevating part 40D to hold the pod 20, i.e., a position at which the holding part 40C is located immediately above the pod 20.

It is confirmed that the pod transfer mechanism 40 waits above the delivery position, and the stage 25 of the AGV port 22 on which the pod 20 to be unloaded is mounted is horizontally moved (slid) to the delivery position. In this regard, the sliding operation of the AGV port 22 and the driving of the pod transfer mechanism 40 may be performed simultaneously.

After it is confirmed by the sensor 28A that the stage 25 has been slid to the delivery position, the elevating part 40D is controlled to lower the holding part 40C to the position at which the pod 20 can be held, and the holding part 40C is controlled to hold the pod 20. When it is confirmed that the holding part 40C holds the pod 20, the elevating part 40D is controlled to raise the holding part 40C.

After it is confirmed by the sensor 25B of the stage 25 that the pod 20 is not mounted on the stage 25, the stage 25 is slid to the mounting position. After it is determined by the sensor 28A that the stage 25 has returned to the mounting position, the pod transfer mechanism 40 is moved to above the transfer port 42 to be delivered or the delivery position of the storage shelf 30.

When transferring the pod 20 to the transfer port 42, the pod transfer mechanism 40 moves to above the mounting portion of the transfer port 42. Thereafter, the elevating part 40D is controlled to lower the holding part 40C and to mount the pod 20 on the mounting portion of the transfer port 42. The mounting portion of the transfer port 42 is located directly below the pod transfer mechanism 40 and does not need to be horizontally moved for delivery.

When transferring the pod 20 to the storage shelf 30, the stage 25 of the storage shelf 30 existing at the transfer destination is horizontally moved (slid) to the delivery position. After it is confirmed by the sensor 28A that the stage 25 has been slid to the delivery position, the elevating part 40D is controlled to lower the holding part 40C and to mount the pod 20 on the stage 25. In this case, the sliding operation of the stage 25 of the storage shelf 30 and the driving of the pod transfer mechanism 40 may be performed simultaneously.
(Lid Opening Step: S11)

When the pod 20 is mounted on the mounting portion of the transfer port 42, the lid of the pod 20 is opened by the FIMS opener as a lid opening/closing mechanism.
(Wafer Charging Step: S12)

When the lid of the pod 20 is opened, a plurality of wafers W in the pod 20 is charged to the boat 58 by the substrate transfer machine 86 (wafer charging).
(Boat Loading Step: S13)

When the plurality of wafers W is charged to the boat 58, the boat 58 is loaded into the process chamber 54 by the boat elevator 82 (boat loading). At this time, the seal cap 78 airtightly closes (seals) the lower end of the reaction tube 50 through the O-ring 78A.

Next, a sequence example of a process of forming a film on a substrate (hereinafter also referred to as a film-forming process) will be described as one of processes of manufacturing a semiconductor device using the above-described substrate processing apparatus 4. Description will now be made on an example in which a film is formed on a wafer W by alternately supplying a first process gas (precursor gas) and a second process gas (reaction gas) to the wafer W as a substrate.

Hereinafter, description will be made on an example in which a silicon nitride film ($Si_3N_4$ film) (hereinafter also referred to as a SiN film) is formed on a wafer W by using a hexachlorodisilane ($Si_2Cl_6$, abbreviation: HCDS) gas as a precursor gas and an ammonia ($NH_3$) gas as a reaction gas. In the following description, the operations of the respective parts constituting the substrate processing apparatus 4 are controlled by the apparatus controller 210.

In the film-forming process according to the embodiments, a SiN film is formed by performing a cycle a predetermined number of times (one or more times), the cycle including non-simultaneously performing: supplying a HCDS gas to the wafer W accommodated in the process chamber 54; removing the HCDS gas (residual gas) from the process chamber 54; supplying an $NH_3$ gas to the wafer W accommodated in the process chamber 54; and removing the $NH_3$ gas (residual gas) from the process chamber 54.

The word "substrate" used in the subject specification is synonymous with the word "wafer."

(Film-Forming Step: S14)

The process chamber 54, i.e., the space in which the wafer W exists, is vacuum-exhausted (depressurization-exhausted) to a predetermined pressure (vacuum degree) by the vacuum pump 74. At this time, the pressure in the process chamber 54 is measured by the pressure sensor 70, and the APC valve 72 is feedback-controlled based on the measured pressure information. The vacuum pump 74 is kept in a constantly operating state at least until the processing on the wafer W is completed.

Furthermore, the wafer W in the process chamber 54 is heated to a predetermined temperature by the heater 46. At this time, the amount of electric power supplied to the heater 46 is feedback-controlled based on the temperature information detected by the temperature detection part 76 so that the process chamber 54 has a predetermined temperature distribution. The heating of the inside of the process chamber 54 by the heater 46 is continuously performed at least until the processing on the wafer W is completed.

In addition, the rotation of the boat 58 and the wafer W by the rotation mechanism 80 is started. The wafer W is rotated as the boat 58 is rotated by the rotation mechanism 80. The rotation of the boat 58 and the wafer W by the rotation mechanism 80 is continuously performed at least until the processing on the wafer W is completed.

When the temperature of the process chamber 54 is stabilized at a preset process temperature, the following two steps, i.e., steps 1 to 2, are sequentially executed.

[Step 1]

The valve 66a is opened to allow a HCDS gas to flow into the gas supply pipe 62a. The flow rate of the HCDS gas is adjusted by the MFC 64 a. The HCDS gas is supplied to the process chamber 54 through the nozzle 60 and is exhausted from the exhaust pipe 68. At this time, the HCDS gas is supplied to the wafer W. At the same time, the valve 66b is opened to allow an $N_2$ gas to flow into the gas supply pipe 62b. The flow rate of the $N_2$ gas is adjusted by the MFC 64b. The $N_2$ gas is supplied to the process chamber 54 together with the HCDS gas and is exhausted from the exhaust pipe 68. By supplying the HCDS gas to the wafer W, a silicon (Si)-containing layer having a thickness of, for example, less than one atomic layer to several atomic layers is formed as a first layer on the outermost surface of wafer W.

After the first layer is formed, the valve 66a is closed to stop the supply of the HCDS gas. At this time, while keeping the APC valve 72 opened, the vacuum pump 74 exhausts the process chamber 54 so that the unreacted HCDS gas or the HCDS gas contributed to the formation of the first layer, which remain in the process chamber 54, is exhausted from the process chamber 54. At this time, while keeping the valve 66b opened, the supply of the $N_2$ gas to the process chamber 54 is maintained. The $N_2$ gas acts as a purge gas, which makes it possible to enhance the effect of discharging the gas remaining in the process chamber 54 from the process chamber 54.

[Step 2]

After step 1 is completed, an $NH_3$ gas is supplied to the wafer W accommodated in the process chamber 54, i.e., the first layer formed on the wafer W. The $NH_3$ gas is thermally activated and supplied to the wafer W.

In this step, the opening/closing control of the valves 66c and 66d is performed in the same procedure as the opening/closing control of the valves 66a and 66b in step 1. The flow rate of the $NH_3$ gas is adjusted by the WC 64c. The $NH_3$ gas is supplied to the process chamber 54 through the nozzle 60 and is exhausted from the exhaust pipe 68. At this time, the $NH_3$ gas is supplied to the wafer W. The $NH_3$ gas supplied to the wafer W reacts with at least a part of the first layer, i.e., the Si-containing layer formed on the wafer W in step 1. As a result, the first layer is thermally nitrided in a non-plasma manner and is changed (modified) into a second layer containing Si and N, i.e., a silicon nitride layer (SiN layer). At this time, a plasma-excited $NH_3$ gas may be supplied to the wafer W, and the first layer may be plasma-nitrided to change the first layer into a second layer (SiN layer).

After the second layer is formed, the valve 66c is closed to stop the supply of the $NH_3$ gas. Then, by virtue of the same process procedure as step 1, the unreacted $NH_3$ gas, the $NH_3$ gas contributed to the formation of the second layer, and the reaction byproduct, which remain in the process chamber 54, are discharged from the process chamber 54. At this time, as in step 1, it is not necessary to completely discharge the gas and the like remaining in the process chamber 54.

A SiN film having a predetermined composition and a predetermined film thickness can be formed on the wafer W by performing a cycle a predetermined number of times (n times), the cycle including non-simultaneously or asynchronously performing the two steps described above. The above cycle is preferably repeated a plurality of times. That is, it is preferable that the thickness of the second layer (SiN layer) formed at the time of performing the above cycle once is set smaller than a predetermined film thickness and the above cycle is repeated a plurality of times until the film thickness of a SiN film formed by stacking the second layers (SiN layers) reaches the predetermined film thickness.

After the film-forming process is completed, the valves 66b and 66d are opened. The $N_2$ gas is supplied from the gas supply pipes 62b and 62d to the process chamber 54 and is exhausted from the exhaust pipe 68. The $N_2$ gas acts as a purge gas. As a result, the process chamber 54 is purged, whereby the gas and the reaction byproduct remaining in the process chamber 54 are removed from the process chamber 54 (purging). Thereafter, the atmosphere in the process chamber 54 is replaced by an inert gas (inert gas replacement), and the pressure in the process chamber 54 is restored to the atmospheric pressure (atmospheric pressure restoration).

(Boat Unloading Step: S15)

After restoring the atmospheric pressure, the seal cap 78 is lowered by the boat elevator 82, and the lower end of the reaction tube 50 is opened. Then, the processed wafer W is unloaded from the lower end of the reaction tube 50 to the outside of the reaction tube 50 while being supported by the boat 58 (boat unloading).

(Wafer Discharging Step: S16)

The processed wafer W is discharged from the boat 58 by the substrate transfer machine 86 (wafer discharging).

(Carrier Unloading Step: S17)

Next, the processed wafer W is stored in the pod 20 by the substrate transfer machine 86. The pod 20 containing the processed wafer W is returned to the load port (the AGV port 22 or the OHT port 32) by an operation opposite to the carrier loading operation and is recovered by the external transfer device.

Figure 5:
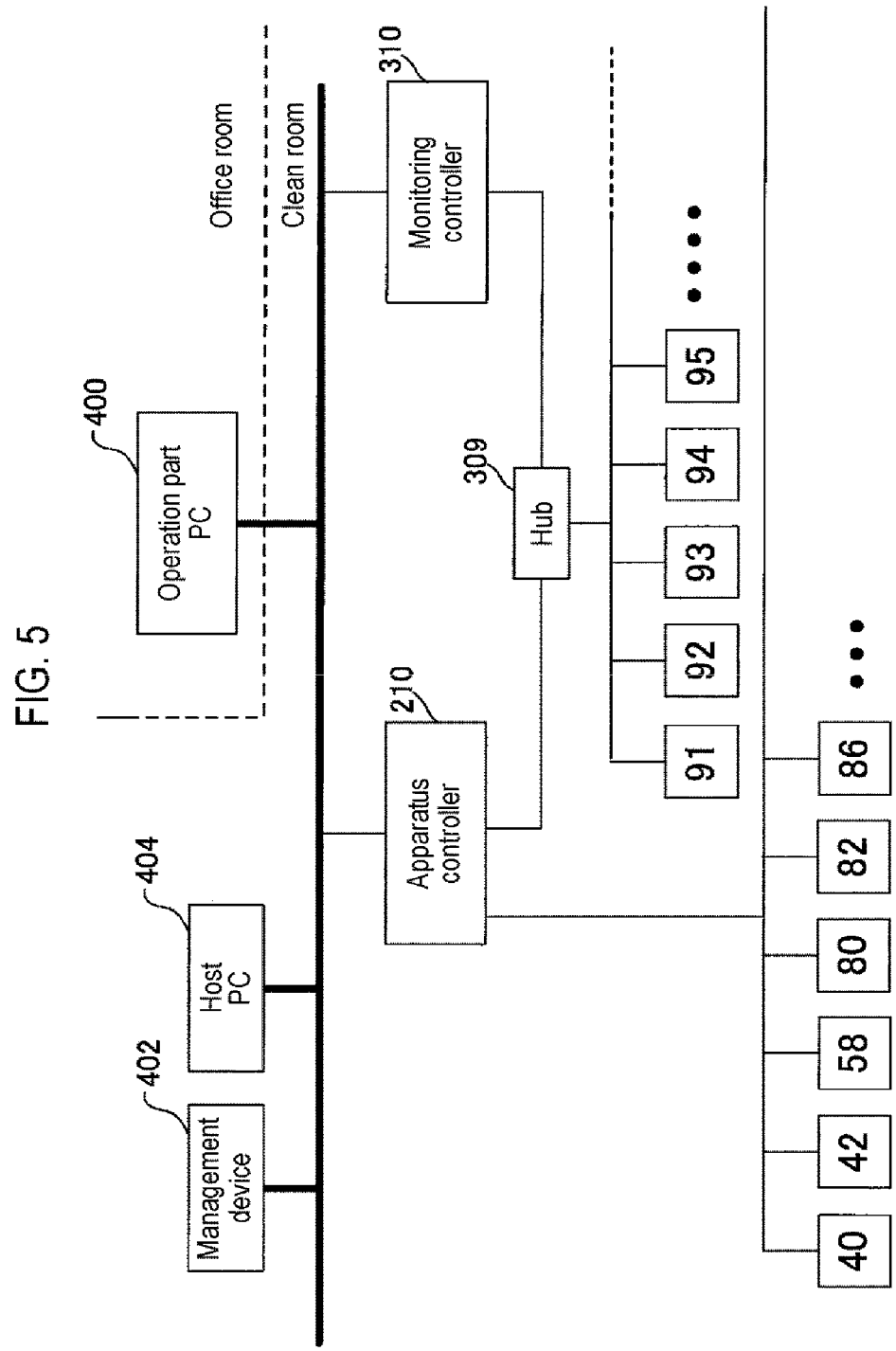
FIG. 5 is a view showing a system configuration of a controller suitably used in some embodiments of the present disclosure.

Next, an apparatus monitoring control system as a substrate processing system according to the embodiments will be described with reference to FIG. 5.

The apparatus monitoring control system according to the embodiments includes cameras 91 to 95, a monitoring controller 310 configured to store image data recorded by the cameras 91 to 95, an apparatus controller 210, a hub 309 configured to connect the apparatus controller 210, the monitoring controller 310 and the cameras 91 to 95, and an operation part PC (Personal Computer) 400 as an operating controller connected to the apparatus controller 210 and the monitoring controller 310. Furthermore, an operation part existing inside the apparatus controller 210 may be used as the operation part. Although the apparatus controller 210, the monitoring controller 310 and the operation part PC 400 are separately illustrated in FIG. 5, it goes without saying that the monitoring controller 310 and the operation part PC 400 may be included in one of the components of the substrate processing apparatus 4. In this case, the monitoring controller 310 and the operation part PC 400 may have the same configuration as the apparatus controller 210. The monitoring controller 310 is capable of accurately holding the image data recorded by the cameras 91 to 95 because the clocks of the monitoring controller 310 and the cameras 91 to 95 are synchronized with millisecond accuracy.

Furthermore, the apparatus controller 210 and the monitoring controller 310 are provided at a clean room in which the substrate processing apparatus 4 is installed. The operation part PC 400 is installed in an office room or the like which is separate from the clean room. That is, the apparatus controller 210 and the monitoring controller 310 are remotely controlled by using the operation part PC 400 remote from the clean room as the input/output device 222. The apparatus controller 210 acquires event data generated at the time of transferring the wafer W and alarm data generated at the time of occurrence of a transfer error. Then, upon acquiring the event data, the apparatus controller 210 transmits an event notification based on the event data to the monitoring controller 310 and the operation part PC 400. The apparatus controller 210 is configured to transmit, at the time of occurrence of a transfer error, an alarm notification including error information based on the alarm data to the monitoring controller 310 and the operation part PC 400. Furthermore, the apparatus controller 210 is configured to transmit, by mail, an alarm notification including error information to a management device 402 and a host PC 404 of a customer or the like and is configured to remotely display the same screen as that of the display part of the operation part PC 400 on the display part of the management device 402 or the host PC 404. As used herein, the term "event data" refers to data acquired from a sensor provided in each transfer mechanism such as a transfer robot or the like. The event data is information (event information) indicative of wafer transfer start and end timings in each step (event) such as the carrier loading step, the lid opening step, the wafer charging step, the boat loading step, the film-forming step, the boat unloading step, the wafer discharging step, the carrier unloading step, or the like. The event data includes event occurrence date and time. Furthermore, the term "alarm data" refers to information (error information) indicative of the occurrence of a transfer error by a transfer means, such as position shift, drop, damage, transfer remaining, or the like, which occurs at the time of transferring the wafer W. The alarm data includes transfer error occurrence date and time. Specifically, the error information includes information on the name of the apparatus where the transfer error occurred, the alarm ID set for the transfer error, the occurrence time of the transfer error, and the like. The details of the cameras 91 to 95 will be described later.

Figure 6:
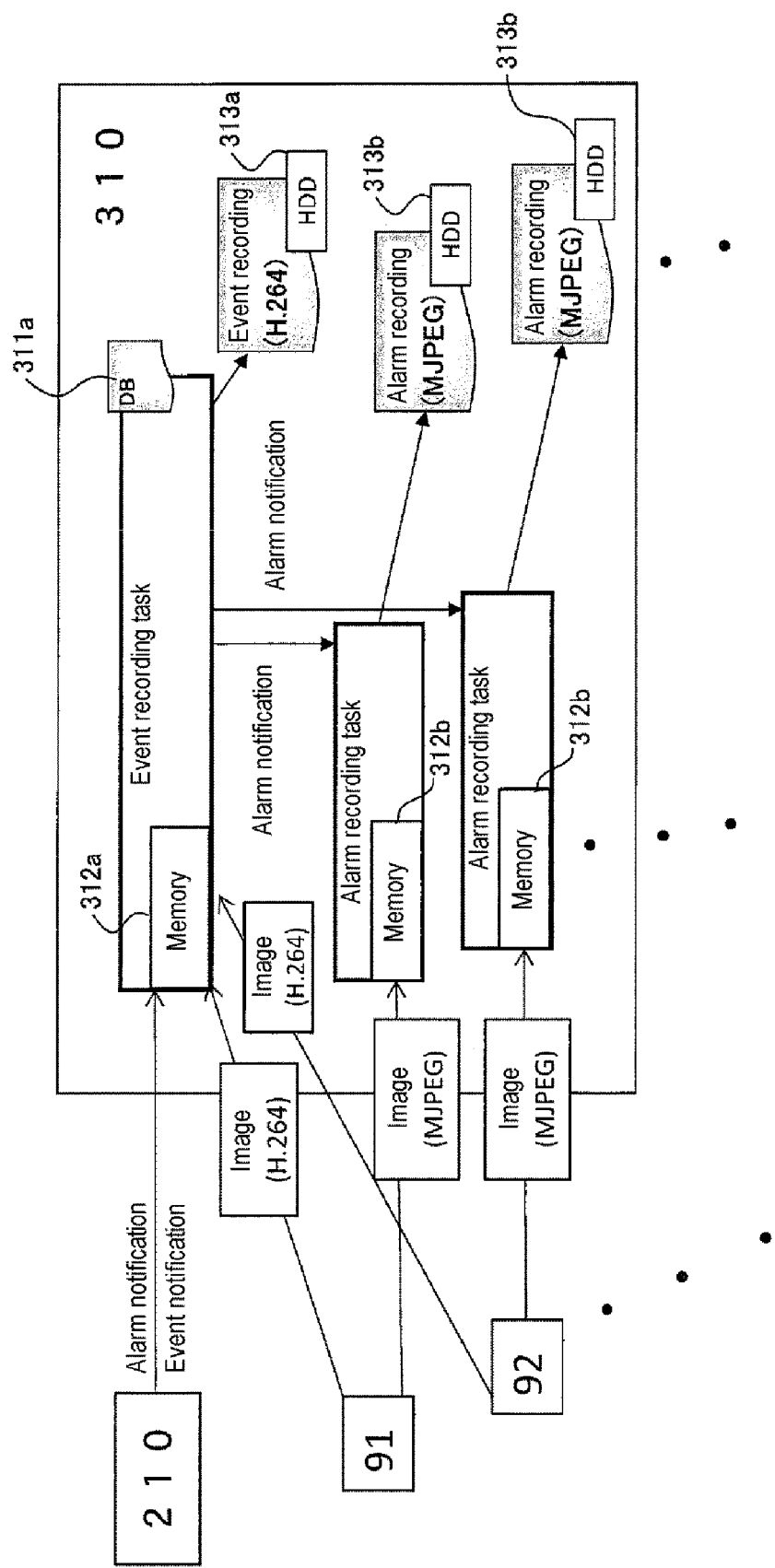
FIG. 6 is a view for explaining a program configuration executed by a monitoring controller that processes image data recorded by a recording means suitably used in some embodiments of the present disclosure.

As shown in FIG. 6, the monitoring controller 310 is configured to simultaneously acquire a motion image (high-compression low-quality image) of H.264 format, which is event image data as first image data described later, and a motion image (low-compression high-definition image) of a motion JPEG (Joint Photographic Experts Group) or M-JPEG (hereinafter referred to as MJPEG) format, which is alarm image data as second image data described later, according to an image recording program executed by the monitoring controller 310. The alarm image data is image data obtained when a failure such as a transfer error or the like occurs, whereas the event image data is image data indicative a transfer state of the substrate until a failure such as a transfer error or the like occurs, or a state of the substrate at the time of normal transfer at which a failure does not occur. The monitoring controller 310 includes a database 311*a* as a storage part for storing a list of event image data and alarm image data, memories 312*a* and 312*b* as buffer parts for temporarily storing motion images of event image data and alarm image data, and memory parts 313*a* and 313*b* as hard disk drives for storing event image data and alarm image data, respectively. Hereinafter, the memory part for storing event image data is referred to as a first memory part 313*a*, and the memory for temporarily storing event image data is referred to as a first memory 312*a*. The memory part for storing alarm image data for each of the cameras 91 to 95 that records the alarm image data is referred to as a second memory part 313*b*, and the memory for temporarily storing alarm image data for each of the cameras 91 to 95 that records the alarm image data is referred to as a second memory 312*b*.

For example, when receiving an event notification indicating the start of transfer of the wafer W (or the pod 20) from the apparatus controller 210, the monitoring controller 310 starts storing the first image data (event image data) recorded by the cameras 91 to 95 in the memory (the first memory 312*a*). The event image data is collected in one first memory 312*a* that temporarily stores the image data recorded by the cameras 91 to 95, and is periodically stored in the first memory part 313*a*. In this case, when receiving an event notification indicating the end of transfer of the wafer W (or the pod 20) from the apparatus controller 210, the monitoring controller 310 stops storing the first image data recorded by the cameras 91 to 95 in the first memory 312*a*, and stores the first image data of the first memory 312*a* in the first memory part 313*a*. For example, when the first memory 312*a* becomes full, the first image data may be collectively transferred to the first memory part 313*a*, or the time for transfer of the first image data to the first memory part 313*a* may be determined in advance by a set value. Then, the event image data (first image data) is converted into a database DB as a below-described "event recording information list" including a storage destination directory of event record files of the event image data and event information. For example, while event information is registered in the database 311a at the timing of an event notification indicating the start, the conversion of the event image data into a file is started in the first memory part 313a. While the database 311a is updated at the timing of an event notification indicating the end, a process (file closing process) of terminating the conversion of the event image data into a file in the first memory part 313a is performed.

After being activated and connected to the cameras 91 to 95, the monitoring controller 310 starts storing the second image data (alarm image data) for several tens of seconds in each memory (the second memory 312b). Using the second image data for several tens of seconds as a ring buffer, the oldest image data is overwritten with the latest image data so that a constant amount of data for the past tens of seconds is always stored. The alarm image data is temporarily stored in the second memory 312b installed in each of the cameras 91 to 95. When the monitoring controller 310 receives, from the apparatus controller 210, an alarm notification indicative of occurrence of a transfer error by a transfer means, such as position shift, drop, damage, transfer remaining, or the like, which occurs at the time of transferring the wafer W, the data for several tens of seconds, for example, 20 seconds before and after the occurrence of the transfer error in a predetermined range before and after the transfer error occurrence of the alarm image data stored in the second memory 312b installed in each of the cameras 91 to 95 is converted into a file and stored in the second memory part 313b installed in each of the cameras 91 to 95. Although not shown, the alarm image data is converted into a database DB as a below-described "alarm recording information list" including a storage destination directory of record files and error information.

The monitoring controller 310 executes an event recording task and an alarm recording task incorporated in the recording monitoring program, whereby the storage of the event image data in the first memory part 313a, the creation of an event recording file, the storage of the alarm image data in the second memory part 313b, and the creation of an alarm recording file are performed. When the HDD capacity of the first memory part 313a is sufficient, or when the camera is focused on a place to be recorded even during non-operation, the event image data may be the constantly-recorded image data to be periodically stored in the first memory part 313a regardless of the event notification indicating the start and end of transfer of the transfer mechanism, which is received from the apparatus controller 210. For example, the data may be image data continuously recorded for 24 hours in N (natural number) days. On the other hand, when the HDD capacity is limited, or when it is desired to hold the image data obtained during a transfer operation as long as possible, the event image data is recorded in the first memory part 313a only during the transfer according to the event notification. The recording method of such event image data (first image data) is set for each of the cameras 91 to 95.

Figure 7:
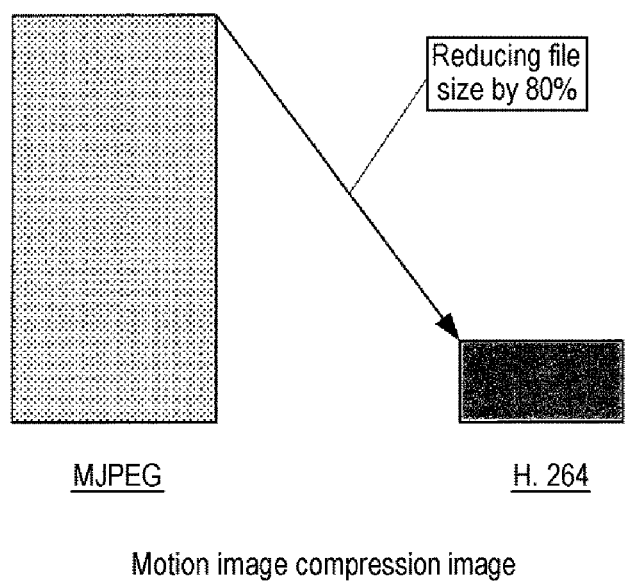
FIG. 7 is a view for explaining image data recorded by the recording means suitably used in some embodiments of the present disclosure.

FIG. 7 shows a motion image format acquired from the cameras 91 to 95. In the present disclosure, the monitoring controller 310 is configured to simultaneously acquire two formats of motion images (image data), i.e., a H.264 format motion image (event image data) and a MJPEG format motion image (alarm image data) from one camera. That is, the cameras 91 to 95 record the transfer operation of the wafer W as event image data, and record the transfer operation of the wafer W as alarm image data having higher definition than the event image data.

For example, as shown in FIG. 8, the images of the MJPEG format (second image data) constitute a motion image by a series of one JPEG format image (hereinafter also referred to as a frame). In FIG. 8, a motion image in which the boat 58 moves up toward the reaction tube 50 is shown in the MJPEG format on a frame-by-frame basis from the left side to the right side. There is no inter-frame dependency in the MJPEG format. The MJPEG format image is very stable because one missing frame generated during data transmission has no effect on the remaining frames. The advantage of the MJPEG format is that no compression other than JPEG compression is performed and the image quality is not degraded. Therefore, for example, if an image is recorded in the MJPEG format when a failure occurs during the operation of the transfer mechanism, it is possible to check a failure occurrence status with image quality of an image (motion image) having no compression other than JPEG compression. The drawback of the MJPEG format is that it is not possible to compress data using video compression techniques because the motion image is a complete image sequence. In the embodiments, an image of 30 frames is recorded per second and stored in the second memory part 313b of the monitoring controller 310. In other words, when an alarm occurs, high-definition image data is stored at intervals of about 33 msec.

As the second image data, a BMP format or a PNG format may be used. In the JPEG image of the MJPEG format, as compared with the H.264 format in which the place having no movement is not recorded, no compression other than JPEG compression is performed and the image quality is less degraded. However, the JPEG compression technique mainly performs the following process. Therefore, when an image is displayed in an enlarged scale, a block-wise noise may be seen (irreversible compression method).

1. Converting color information from RGB to YCbCr
2. Classifying all the pixels into 8×8 blocks.
3. Subjecting each block to DCT (frequency analysis) and quantizing the resultant values
4. Scanning the quantized values in zigzag and performing run length coding
5. Compressing DC components by DPCM (differential pulse code modulation)
6. Encoding the compressed DC components with a Huffman code and output them in the order of blocks In the BMP format, special compression is not applied, the file size is large, the structure is simple and highly versatile, and the image information is maintained as it is (reversible compression method). The PNG format is an image format for use in a reversible compression method. Therefore, there is no image degradation due to compression. Accordingly, if the second image data is recorded in the BNP format or the PNG format, there is no noise in block units when displayed in an enlarged scale. This makes it possible to clearly confirm the situation.

TABLE 1

|  | BMP | PNG | JPEG |
| --- | --- | --- | --- |
| Color number | 24-bit full color | 24-bit full color & 48-bit full color | 24-bit full color |
| Image degradation | no | no | yes |
| Data size | very large | relatively small | very small |

In this regard, the first image data is the latest MPEG standard for video encoding, which is also called MPEG-4 Part 10 AVC (Advanced Video Coding). H.264 is expected as a next-generation video compression standard. As shown in FIG. 7, the data size of H.264 is reduced by 80% or more as compared with MJPEG and is reduced by 50% or more as compared with MPEG-4, thereby greatly reducing, for example, the storage capacity of the first memory part 313*a*. In an image frame, the amount of data can be reduced by deleting unnecessary information. For example, as shown in FIG. 9, the places where there is no change between the previous and next frames are deleted. In FIG. 9, a motion image in which the boat 58 moves up toward the reaction tube 50 is displayed in the H.264 format as in FIG. 8 for every one frame from the left side to the right side. This one frame is 0.033 msec as in the case of the MJPEG format image (second image data). In the H.264 format, when compressing image data, the moving part and the stationary part are separated between the frames. As for the moving part, the image data is frequently rewritten according to the change of the time axis. However, as for the stationary part, the original image data is used under the assumption that, even if there is a change in time, no change occurs in the image data. Although the compression ratio is greatly increased, noise may be generated and the image may be unclear if the moving part and the stationary part are not properly separated.

The H.264 format is basically the same as MPEG-2. The H.264 format uses the discrete cosine transform (DCT) for motion compensation (MC) inter-frame predictive coding system. The H.264 format is a system called MC+DCT. The H.264 format is standardized to achieve ultra-high compression which is twice or more than that of the image compression coding system using MPEG-2 or MPEG-4.

Figure 10A:
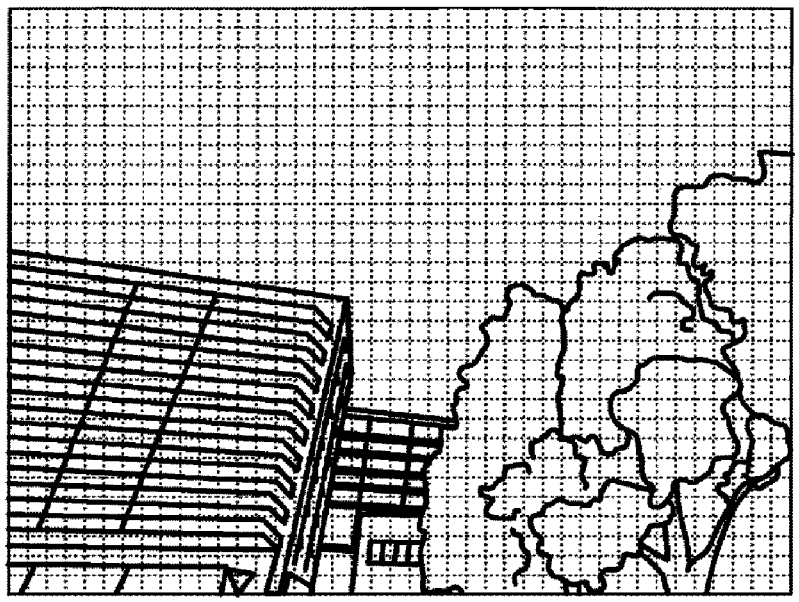
FIG. 10A is a view for explaining an H.264 format, and FIG. 10B for explaining an H.265 format.
Figure 10B:
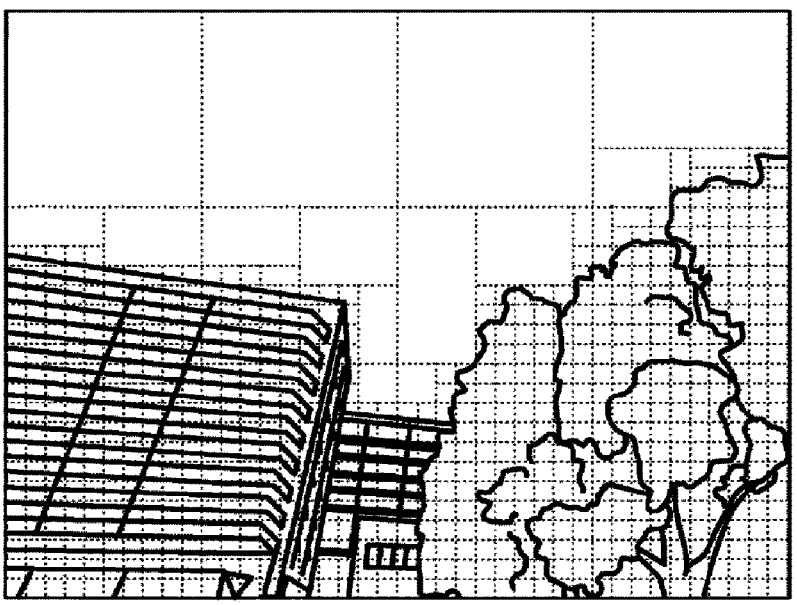

In order to achieve higher compression of image data, for example, the H.265 format may be used as shown in FIG. 10B. In the H.264 format, as shown in FIG. 10A, the entire screen is finely divided into blocks and only the changed portion is transmitted to the monitoring controller. In other words, a greatly-changed block and a relatively-slightly-changed block are transmitted as the same small block. In the H.265 format, it is possible to optimize the compression rate and to reduce the total amount of information by setting the greatly-changed block as a fine block and the relatively-slightly-changed block as a large block without fixing the block to a fine block. When applying the image data of the H.264 format or the H.265 format to a semiconductor manufacturing apparatus, it is an effective means generally for applications not requiring a higher image quality, such as the purpose of monitoring a flow meter by the operator's screen operation.

Figure 11A:

With regard to the storage of a file of the MJPEG format, as shown in FIG. 11A, motion images are usually stored in one file such as ".avi" or ".mov". That is, in this format, when playing back one file with a player, frame-by-frame playback cannot be performed and only slow playback can be performed.

Figure 12:
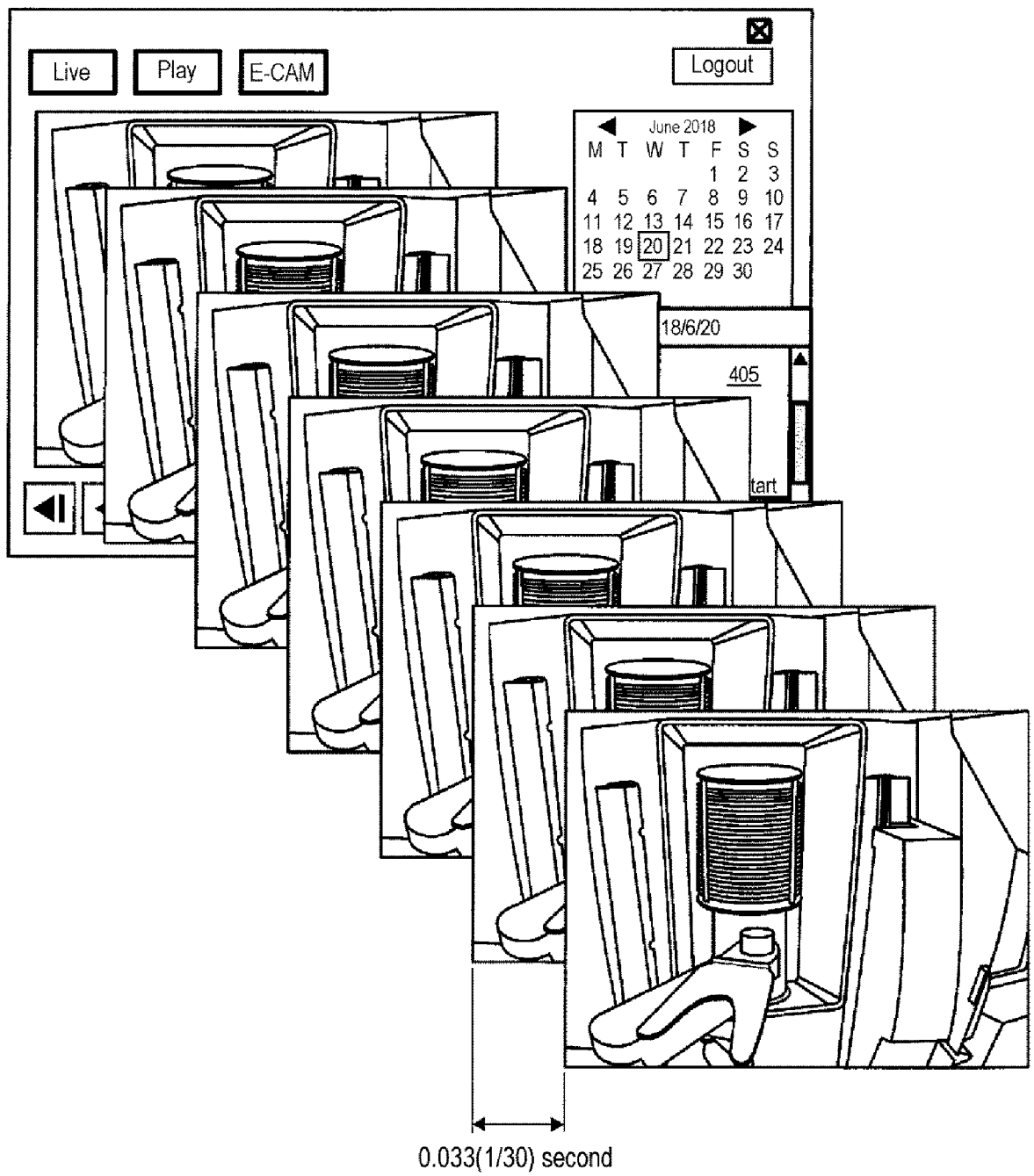
FIG. 12 is a view for explaining frame-by-frame playback of alarm recording.

In the alarm recording of the present disclosure, as shown in FIG. 11B, a still image of 30 frames per second is taken as a JPEG file and is outputted for a total of 40 seconds including 20 seconds before failure and 20 seconds after failure. That is, JPEG files of 30 frames×40 seconds=1200 files are stored. By using this technical solution method, super slow playback is realized by performing frame-by-frame playback of an image at 0.033 second intervals. FIG. 12 shows an image subjected to frame-by-frame playback of an image at 0.033 second intervals. The transfer mechanism for transferring the wafer W transfers three sets of pods 20 (up to 75 wafers W) to the boat 58 in about 9 to 10 minutes. Therefore, for the investigation at the time of failure occurrence, it is required to be able to acquire and play back images at shorter intervals.

Depending on customers, it is required to store motion images for several months (three months or more). In order to meet the requirements, image data is recorded at a higher compression rate (in a H.264 format or a next-generation H.265 format). However, the highly-compressed image data is compressed by image comparison on a time axis. Therefore, when an important scene is outputted at the time of occurrence of a failure, the image may become unclear. In the H.264 format and the H.265 format, frame-by-frame playback cannot be performed because the image is created with reference to the information on the preceding and succeeding frames. Accordingly, it is possible to perform frame-by-frame playback of images and to check the images by simultaneously recording images in the MJPEG format before and after occurrence of an error and storing the images obtained at the time of occurrence of a failure as high-definition images.

The state in which a semiconductor substrate such as a wafer W or the like is transferred is constantly recorded and stored. When a transfer error or the like occurs, the factor causing the transfer error is investigated with reference to the recorded image data.

However, if the event image data to be constantly recorded is recorded in a low-compression/high-definition MJPEG format even when a failure such as a transfer error or the like does not occur, the storage capacity for storing the image data becomes enormous.

Therefore, in the embodiments, the event image data to be constantly recorded even when a failure such as a transfer error or the like does not occur is stored in a high-compression/low-image-quality H.264 format. The alarm image data to be recorded only when a failure such as a transfer error or the like occurs is stored in a low-compression/high-definition MJPEG format.

Next, the imaging points of the cameras 91 to 95 will be described with reference to FIG. 13. The imaging target of the camera is mainly a transfer mechanism for transferring the wafer W and may be, for example, the transfer port 42, the pod transfer mechanism 40, the substrate transfer machine 86, the boat 58, or the like. The cameras 91 to 95 are used for the purpose of delivery confirmation of the pod 20 at the transfer port 42, pod transfer operation confirmation, confirmation of taking-out of the wafer W from the pod 20 and charging/discharging of the wafer W to/from the boat 58, confirmation of the state of the wafer under movement by the substrate transfer machine 86, confirmation of the up/down movement of the boat 58 and the wafer W charged to the boat 58, and the like. Furthermore, motion images and still images are acquired as image data which are stored in the first memory part 313*a* or the second memory part 313*b* of the monitoring controller 310. The cameras 91 to 95 is configured to automatically control exposure (illumination) according to the operation of the transfer mechanism (imaging target) such as the transfer port 42, the pod transfer mechanism 40, the substrate transfer machine 86, the boat 58 or the like and the surrounding environment.

The motion images (event image data) acquired by the cameras 91 to 95 during the carrier loading/unloading by the pod transfer mechanism 40, during the charging/discharging of the wafer W by the substrate transfer machine 86 and during the loading/unloading of the boat 58 are stored in the first memory part 313*a*. In other words, the event image data is converted into a file and accumulated in the first memory part 313*a* every predetermined time (predetermined event). For example, the event image data is converted into a file and accumulated at each substrate transfer step such as the charging/discharging of the wafer W or the like. In addition, the file conversion cycle (the predetermined time) is not limited to each event and may be set as appropriate.

Furthermore, the monitoring controller 310 is configured to acquire still images after the FIMS opening, after the wafer charging completion and after the boat unloading. This is because, in the confirmation of the wafer W after the FIMS opening and after the completion of the transfer process, at least the occurrence of an abnormality can be grasped by merely confirming the still images. In the embodiments, low-compression/high-definition still images having a format similar to that of the alarm image data are acquired so as to grasp the detailed status of the transfer error. Even in the lid opening step for the pod 20 performed by the FIMS opener, motion images may be acquired as in other transfer events.

Next, the relationship between the imaging target of each of the cameras 91 to 95 and the alarm ID will be described with reference to FIG. 14. FIG. 14 shows a table used when the recording at the time of transfer error occurrence (at the time of failure occurrence) is limited from the imaging targets and the alarm IDs.

As shown in FIG. 14, when the number of cameras to be installed is five, alarm IDs are set for the transfer errors caused by the respective imaging targets. That is, the alarm IDs are associated with the imaging targets and the cameras 91 to 95 so that the imaging targets and the cameras 91 to 95 can be specified from the alarm IDs.

The camera 91 (camera number 1) captures an image of a state in which the pod 20 as a carrier is delivered between the external transfer device and the AGV port 22 and the OHT port 32. In addition, even if a transfer error occurs during the delivery of the pod 20, the camera number and the imaging target can be specified from the alarm ID. Detection means (e.g., sensors) for detecting actual occurrence of a transfer error are respectively installed in the AGV port 22 and the OHT port 32 or in the vicinity thereof.

The camera 92 (camera number 2) captures an image of a state in which the pod 20 is delivered between the pod transfer mechanism 40 and the transfer port. Furthermore, the camera 92 captures an image of the pod transfer mechanism 40 between the carrier loading step and the carrier unloading step described above, i.e., between the AGV port 22 and the OHT port 32 and the transfer port 42. Even if a transfer error occurs between the carrier loading step and the carrier unloading step, the camera number and the imaging target can be specified from the alarm ID. In addition, a sensor for detecting actual occurrence of a transfer error is installed in the pod transfer mechanism 40.

The camera 93 (camera No. 3) captures an image of a state in which the lid of the pod 20 mounted on the mounting portion of the transfer port 42 is opened by the FIMS opener. Even if an error such as a wafer pop-out or the like occurs after the lid of the pod 20 is opened by the FIMS opener, the camera number and the imaging target can be specified from the alarm ID. In addition, a sensor for detecting actual occurrence of a transfer error is installed in the FIMS opener (lid opening/closing mechanism) existing in the transfer port 42.

The camera 94 (camera number 4) and the camera 95 (camera number 5) capture an image of a state in which the wafer W is transferred by the substrate transfer machine 86 between the pod 20 on the mounting portion of the transfer port 42 and the boat 58, and capture an image of a state in which the boat 58 is raised or lowered between the transfer chamber 16 and the process furnace 8. That is, the camera 94 and the camera 95 capture an image of a transfer state of the wafer W and an image of a raising/lowering state of the boat 58 between the wafer charging step and the wafer discharging step described above and between boat loading step and boat unloading step described above. Even if a transfer error occurs between the wafer charging step and the wafer discharging step or between the boat loading process and the boat unloading process, the camera number and the imaging target can be specified from the alarm ID. In addition, a sensor for detecting actual occurrence of a transfer error is installed in the substrate transfer machine 86.

By having the table shown in FIG. 14, when receiving an alarm notification indicating occurrence of a transfer error and including the alarm ID from the apparatus controller 210, the monitoring controller 310 can specify a target camera number from the notified alarm ID. Then, the monitoring controller 310 acquires alarm image data limited to the specified camera number and performs alarm recording (stores the alarm image data in the second memory part 313*b* of each camera number).

The alarm recording function of the monitoring controller 310 makes it possible to acquire high-definition motion images (alarm image data). However, due to the low compression, the file capacity becomes large and occupies the memory part. Therefore, by applying the table shown in FIG. 14 in which the alarm ID and the camera number are defined according to the location where the transfer error has occurred, it is possible to enhance the effect of reducing the amount of data in the memory part of the monitoring controller 310.

Figure 15:
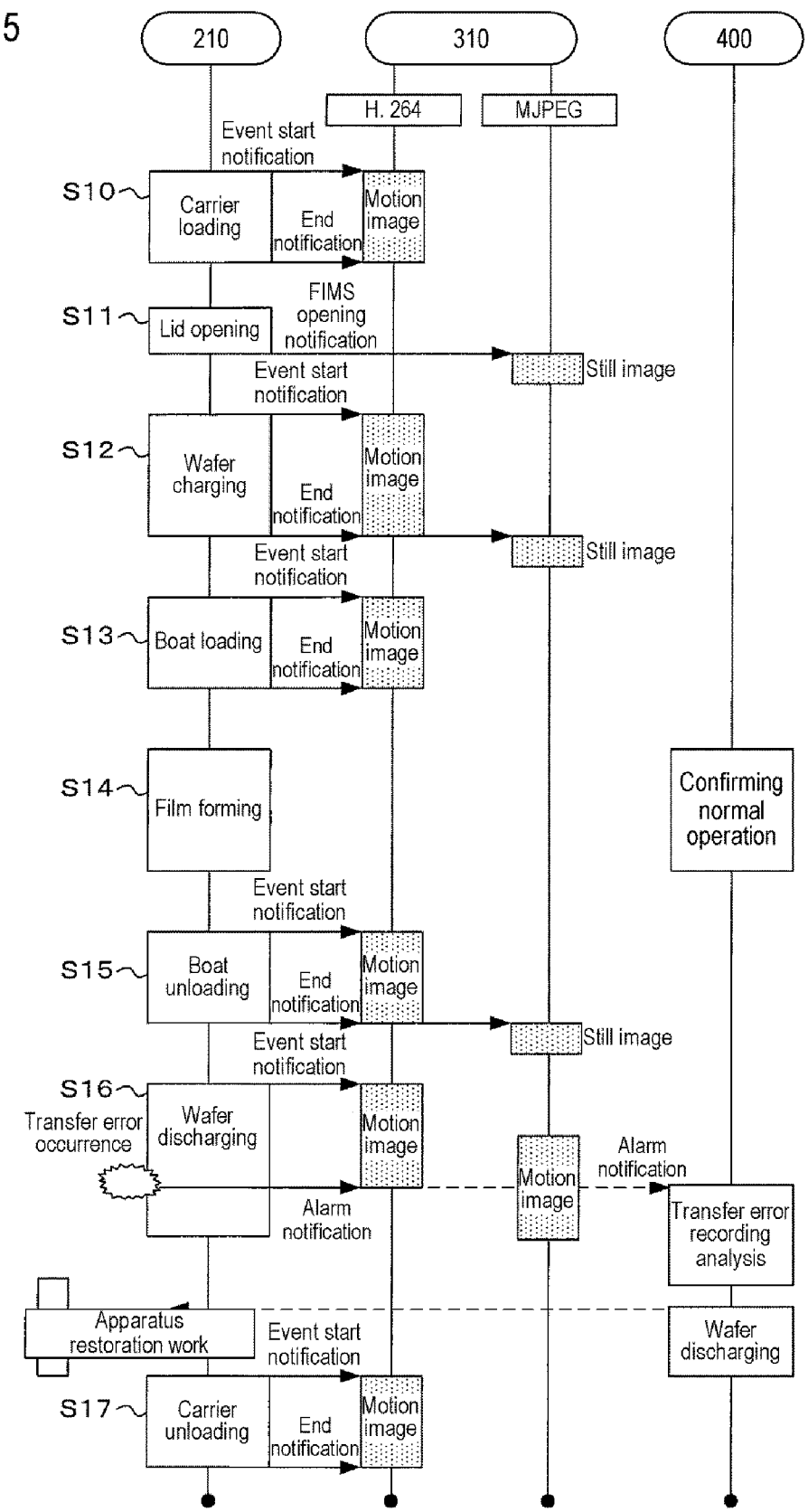
FIG. 15 is a diagram for explaining a flow of an image monitoring program suitably used in some embodiments of the present disclosure.

Next, a flow of monitoring a transfer operation in the substrate processing apparatus 4 using the monitoring controller 310 according to the embodiments will be described mainly with reference to FIG. 15. Description will now be made on, for example, a case where a transfer error (failure) occurs in the wafer discharge step of step S16. A case where the operation part PC 400 is used will be described below by way of example.

(Carrier Loading Step: S10)

When receiving a transfer request for the pod 20 from an external computer such as the operation part PC 400 or the like, the apparatus controller 210 transmits an event notification indicating a carrier loading start event to the monitoring controller 310. Upon receiving this event notification, the monitoring controller 310 causes the camera 91 (camera number 1) to start image capturing.

When the pod 20 is mounted on the AGV port 22 or the OHT port 32 from the external transfer device, the apparatus controller 210 may transmit an event notification indicating a carrier loading start event to the monitoring controller 310.

The camera 91 captures an image of a state in which the pod 20 as a carrier is delivered between the external transfer device and the AGV port 22 and the OHT port 32. When the pod 20 is mounted on the AGV port 22 or the OHT port 32, the monitoring controller 310 is configured to cause the first memory part 313*a* to store (event-record) the event image data acquired by the camera 91.

When the pod 20 is mounted on the AGV port 22 or the OHT port 32, the monitoring controller 310 is configured to switch the camera 91 to the camera 92 (camera number 2) and causes the camera 2 to capture an image of a state of the pod transfer mechanism 40 existing between the AGV port 22 and the OHT port 32 and the transfer port 42.

When the pod 20 is mounted on the mounting portion of the transfer port 42, the apparatus controller 210 transmits an event notification indicating a carrier loading end event to the monitoring controller 310. Upon receiving the event notification, the monitoring controller 310 terminates the image capturing performed by the camera 92. Then, the event image data acquired by the camera 92 is stored (event-recorded) in the first memory part 313a.

(Lid Opening Step: S11)

Next, a step of opening the lid of the pod 20 by the FIMS opener is performed. The apparatus controller 210 transmits an event notification indicating a lid opening operation end event for the pod 20 by the FIMS opener to the monitoring controller 310. When receiving this end event notification, the monitoring controller 310 causes the camera 93 to capture an image (a still image). The apparatus controller 210 may transmit an event notification indicating the FIMS opening event to the monitoring controller 310 so that a motion image can be captured as in other cameras.

(Wafer Charge Step: S12)

When receiving a transfer request for the wafer W from an external computer (not shown) or the like, the apparatus controller 210 transmits an event notification indicating a wafer charging start event to the monitoring controller 310. Upon receiving this event notification, the monitoring controller 310 causes the camera 94 (camera number 4) or the camera 95 (camera number 5) to start image capturing and creates an event recording information list.

The camera 94 or the camera 95 captures an image of a state in which the wafer W is transferred between the pod 20 on the mounting portion of the transfer port 42 and the boat 58.

When the wafer W is charged to the boat 58, the apparatus controller 210 transmits an event notification indicating a wafer charging end event to the monitoring controller 310. Upon receiving this event notification, the monitoring controller 310 causes the camera 94 or the camera 95 to terminate image capturing.

The event image data acquired by the camera 94 or the camera 95 is stored (event-recorded) in the first memory part 313a.

(Boat Loading Step: S13)

When receiving an instruction request for execution of a process recipe from an operation part (not shown) or the like, the apparatus controller 210 transmits an event notification indicating a boat loading start event to the monitoring controller 310. Upon receiving this event notification, the monitoring controller 310 causes the camera 94 or the camera 95 to start image capturing.

The camera 94 or the camera 95 captures an image of a state in which the boat 58 is raised or lowered between the transfer chamber 16 and the process furnace 8. Alternatively, a camera for capturing an image of the boat 58 being raised or lowered and a camera for capturing an image of the wafer W being transferred between the pod 20 and the boat 58 may be separately provided.

When the boat 58 is loaded into the process furnace 8, the apparatus controller 210 transmits an event notification indicating a boat loading end event to the monitoring controller 310. Upon receiving this event notification, the monitoring controller 310 causes the camera 94 or the camera 95 to terminate image capturing. The event image data acquired by the camera 94 or the camera 95 is stored (event-recorded) in the first memory part 313a.

(Film-Forming Step: S14)

Next, a process recipe is executed to perform a film-forming process on the wafer W. In this step, the monitoring controller 310 stops the operations of all the cameras 91 to 95. The operation part PC 400 may cause the operation screen of the operation part PC 400 or the like to display the image data (the motion images or the still images) acquired in the transfer events (the carrier loading step, the lid opening step, the wafer charging step and the boat loading step) which have been completed so far. This makes it possible to confirm the operation.

Figure 16:
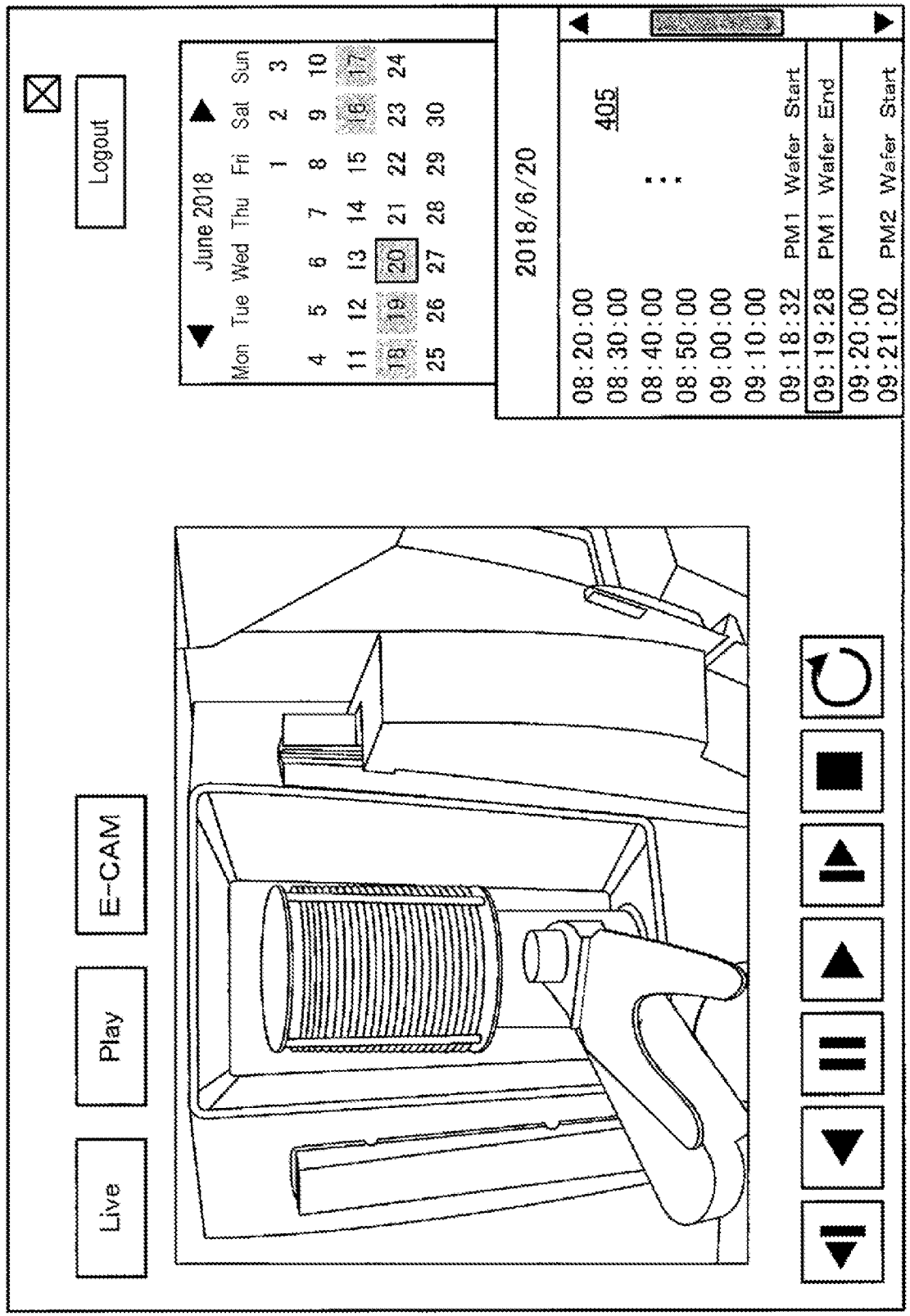
FIG. 16 is an illustrative example of an event cue function suitably used in some embodiments of the present disclosure.

Specifically, as shown in FIG. 16, an event recording information list 405 is displayed on the operation screen of the operation part PC 400. The event recording information list 405 displays event information such as event occurrence date and time, event contents and the like. Then, when the event information written in the event recording information list 405 is selected, each event is cued. Thus, the motion images from the start to the end of each event can be played back. Furthermore, when a plurality of batches is stored, a predetermined button can be pressed on the operation screen, and comparison display between different batches can be performed in the same event.

As a result, although the normal operation is confirmed and no transfer error occurs, the difference in time from the start to the end of the event can be found in the same transfer event, and a measure can be taken in advance so that the transfer error does not occur. The normal operation confirmation may be performed after the substrate processing process is completed.

(Boat Unloading Step: S15)

At the time of transition to the boat unloading step of the process recipe, the apparatus controller 210 transmits an event notification indicating a boat unloading start event to the monitoring controller 310. Upon receiving this event notification, the monitoring controller 310 causes the camera 94 or the camera 95 to start image capturing.

The camera 94 or the camera 95 captures an image of a state in which the boat 58 is lowered between the transfer chamber 16 and the process furnace 8.

When the boat 58 is lowered to the transfer chamber 16, the apparatus controller 210 transmits an event notification indicating a boat unloading end event to the monitoring controller 310. Upon receiving this event notification, the monitoring controller 310 causes the camera 94 or the camera 95 to terminate the image capturing. The event image data acquired by the camera 94 or the camera 95 is stored (event-recorded) in the first memory part 313a.

(Wafer Discharging Step: S16)

The apparatus controller 210 transmits an event notification indicating a wafer discharging start event to the monitoring controller 310. Upon receiving this event notification, the monitoring controller 310 causes the camera 94 or the camera 95 to start image capturing.

The camera 94 or the camera 95 captures an image of a state in which the wafer W is transferred between the pod 20 on the mounting portion of the transfer port 42 and the boat 58. If a transfer error occurs during the transfer of the wafer W between the pod 20 on the transfer port 42 and the boat 58, the alarm image data for several tens of seconds before and after the transfer error occurrence, for example, 20 seconds before and after the transfer error occurrence, is stored (alarm-recorded) in the second memory part 313b of the monitoring controller 310.

Furthermore, the alarm notification notified from the apparatus controller 210 at the time of occurrence of a transfer error includes a notification indicating the end of the transfer event. However, this notification is an event abnormal end notification indicating that an abnormality has occurred in the transfer event. In the embodiments, the event abnormal end notification is information included in the alarm notification. On the other hand, the apparatus controller 210 may be configured to separately notify the monitoring controller 310 and the operation part PC 400 of the event abnormal end notification and the alarm notification. The notification method is not particularly limited. According to the embodiments, in the wafer discharging step (S16), the image data acquired from the event start notification to the event abnormal end notification (i.e., the occurrence time of a transfer error) is converted into a file and stored as event image data in the first memory part 313a of the monitoring controller 310.

The monitoring controller 310 is configured to acquire still images after the lid opening step (S11), after the transfer of the wafer W (after the wafer charging step (S12)) or after lowering the boat 58 (after the boat unloading step (S15)). At this time, the monitoring controller 310 may cause the cameras 91 to 95 to capture still images having higher definition and lower compression (MJPEG format) than event image data and may convert the still images into a file and store them in the second memory part 313b.

Figure 17:
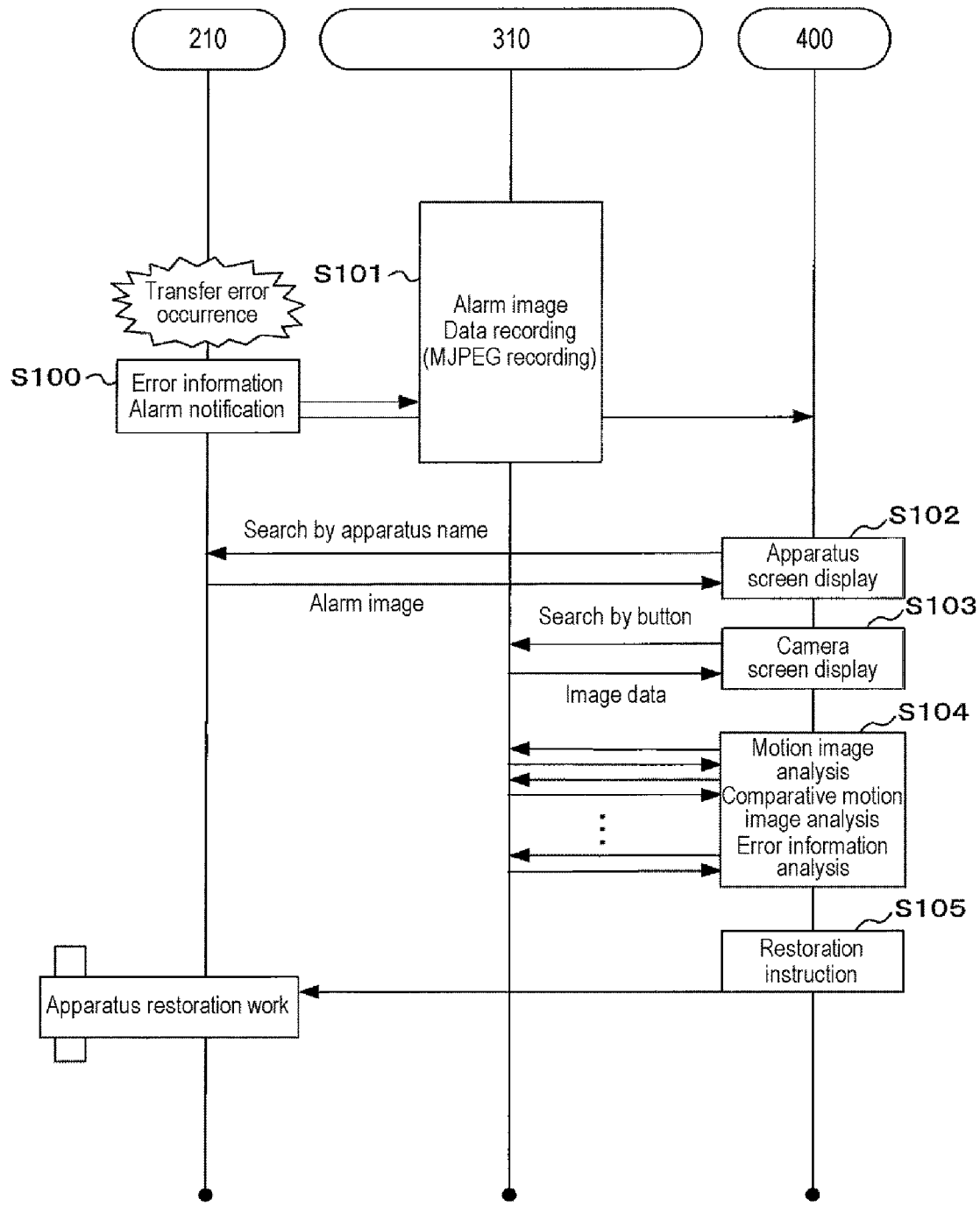
FIG. 17 is a diagram for explaining the main parts of the flow of the image monitoring program suitably used in some embodiments of the present disclosure.

A sequence from the occurrence of a transfer error to the analysis of an abnormality will now be described in detail with reference to FIG. 17. Sensors as detection means for detecting a transfer error generated during the transfer of the wafer W are respectively attached to the transfer means for transferring the wafer W, such as the pod transfer device 40, the substrate transfer machine 86, the boat 58, and the like. The apparatus controller 210 acquires event data by the sensors.

The monitoring controller 310 holds the alarm image data acquired from each of the cameras 91 to 95 in the second memory 312b so that the alarm image data acquired for several tens of seconds in the past can be recorded at the time of occurrence of a transfer error. Then, when a transfer error is detected by a sensor (not shown), the apparatus controller 210 is configured to acquire alarm data and stop these transfer means.

Then, the apparatus controller 210 alarm-notifies error information to the monitoring controller 310 (S100). The error information includes at least the name of the device in which the transfer error has occurred, an alarm ID indicating the transfer error, and the occurrence time of the transfer error. In this regard, the device name is not only the information (apparatus name data) specifying the substrate processing apparatus 4 but also the information (name data) specifying the device that constitutes the substrate processing apparatus 4, such as the load port 22, the pod transfer mechanism 40, the lid opening/closing mechanism, the substrate transfer machine 86, the boat 58, the rotation mechanism 80, the boat elevator 82, the cameras 91 to 95, or the like. Then, after acquiring the alarm notification, the monitoring controller 310 stores, in the second memory part 313b, the alarm image data of a low-compression/high-definition MJPEG format acquired for a few tens of seconds before and after the transfer error occurrence, for example, 20 seconds before and after the transfer error occurrence (S101). In other words, the monitoring controller 310 is configured to convert the alarm image data held in the second memory 312b into a file and store (alarm-record) them in the second memory part 313b.

Furthermore, the apparatus controller 210, for example, alarm-notifies error information to the operation part PC 400 at the same timing as the monitoring controller 310 (S100). Then, the same failure occurrence screen as that of the substrate processing apparatus in which a failure has occurred is displayed on the operation part PC 400 (S102). Then, when the device (e.g., the E-CAM button 410 shown in FIG. 19 or the like) for displaying the image data recorded by the cameras 91 to 95 is selected on the operation screen, the monitoring controller 310 causes the operation part PC 400 to display an alarm information screen including image data (event image data) at the time of alarm occurrence from the alarm ID or the error information at the time of transfer error occurrence. Since the operation part PC 400 is remotely connected to the monitoring controller 310, the alarm information screen can be displayed on the display portion of the operation part PC 400 (S103). In the embodiments, the operation screen (alarm information screen) of the operation part PC 400 is configured to be provided with a button for displaying the event image data and/or the alarm image data recorded by the cameras 91 to 95. That is, by causing the operation screen of the operation part PC 400 to display the event image data and/or the alarm image data recorded by the cameras 91 to 95, the monitoring controller 310 can perform transfer error recording analysis such as motion image analysis, comparative motion image analysis, error information analysis or the like (S104). Then, in the operation part PC 400, a restoration instruction (S105) is issued to a clean room operator or the like, thereby performing the restoration operation of the apparatus in which the transfer error has occurred.

Figure 18:
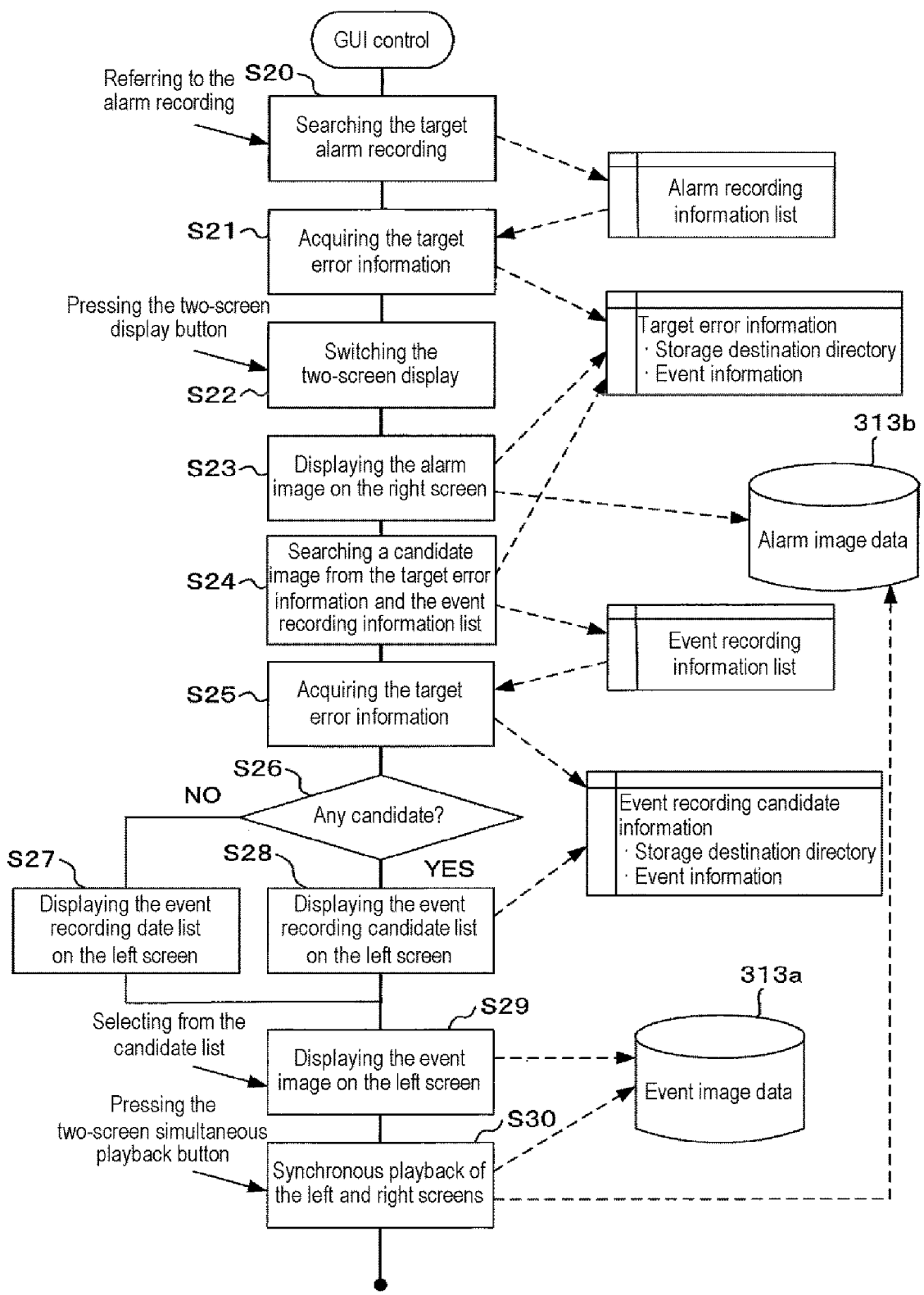
FIG. 18 is a sequence for explaining a comparison screen display function suitably used in some embodiments of the present disclosure.

Hereinafter, a screen display flow executed by the monitoring controller 310 for remote display on the operation screen of the operation part PC 400 will be described with reference to FIG. 18.

For example, when an alarm recording reference notification is acquired after a button (e.g., an E-CAM button 410 shown in FIG. 19 or the like) for referring to a predetermined alarm regarding a transfer error is pressed on the operation screen of the operation part PC400, the monitoring controller 310 searches the alarm recording information list (step S20). Then, as a result of the search, the target error information such as a storage destination directory of the alarm recording file of the target alarm image data, event information at the time of transfer error occurrence, or the like is acquired, and the search result is stored (step S21). In this regard, the event information in the target error information refers to any timing in the carrier loading step, the lid opening step, the wafer charging step, the boat loading step, the film-forming step, the boat unloading step, the wafer discharging step and the carrier unloading step. Furthermore, in the embodiments, the clocks of the monitoring controller 310 and the cameras 91 to 95 are synchronized. Therefore, the playback start timings of the image data recorded by the cameras 91 to 95 can be matched (at least finely adjusted) at the start of the event information or at the time of transfer error occurrence. Details will be described later.

Then, when a two-screen display button is pressed on the operation screen of the operation part PC 400, the monitoring controller 310 refers to the target error information at the time of a two-screen switching process (step S22) and displays the alarm image data stored in the second memory part 313b on the right screen (step S23). Then, the event information at the time of transfer error occurrence is acquired as the target error information (step S24). The storage destination directory of the event recording file having the matched event information and the search result of the event information are acquired from the event recording information list and are stored as event recording candidate information (step S25).

Then, if a display candidate having the matched event information is not present in the event recording candidate information (if NO in step S26), the event recording information list storing the event image data of the same date as the time stamp at the time of transfer error occurrence is displayed on the left screen of the operation screen of the operation part PC 400 (step S27).

Then, if a display candidate having the matched event information is present in the event recording candidate information (if YES in step S26), the event recording information list storing the event image data having the same event information as that available at the time of transfer error occurrence is acquired from the event recording candidate information and displayed on the left screen (step S28).

Then, when the event recording files to be simultaneously played back is selected from the list displayed on the left screen, the event image data stored in the second memory part 313b is displayed with reference to the selected event recording files (step S29). In other words, the monitoring controller 310 displays both the event image data and the alarm image data on the same screen. Then, when a two-screen simultaneous playback button is pressed, the alarm image data and the event image data are synchronously played back (simultaneous playback) on the left and right screens (step S30).

The above-described two-screen display and simultaneous playback are not limited to the alarm image data and the event image data. Two types of alarm image data or two types of event image data may be simultaneously displayed on the same screen for simultaneous playback. This may assist in failure analysis of a transfer error.

Figure 19:
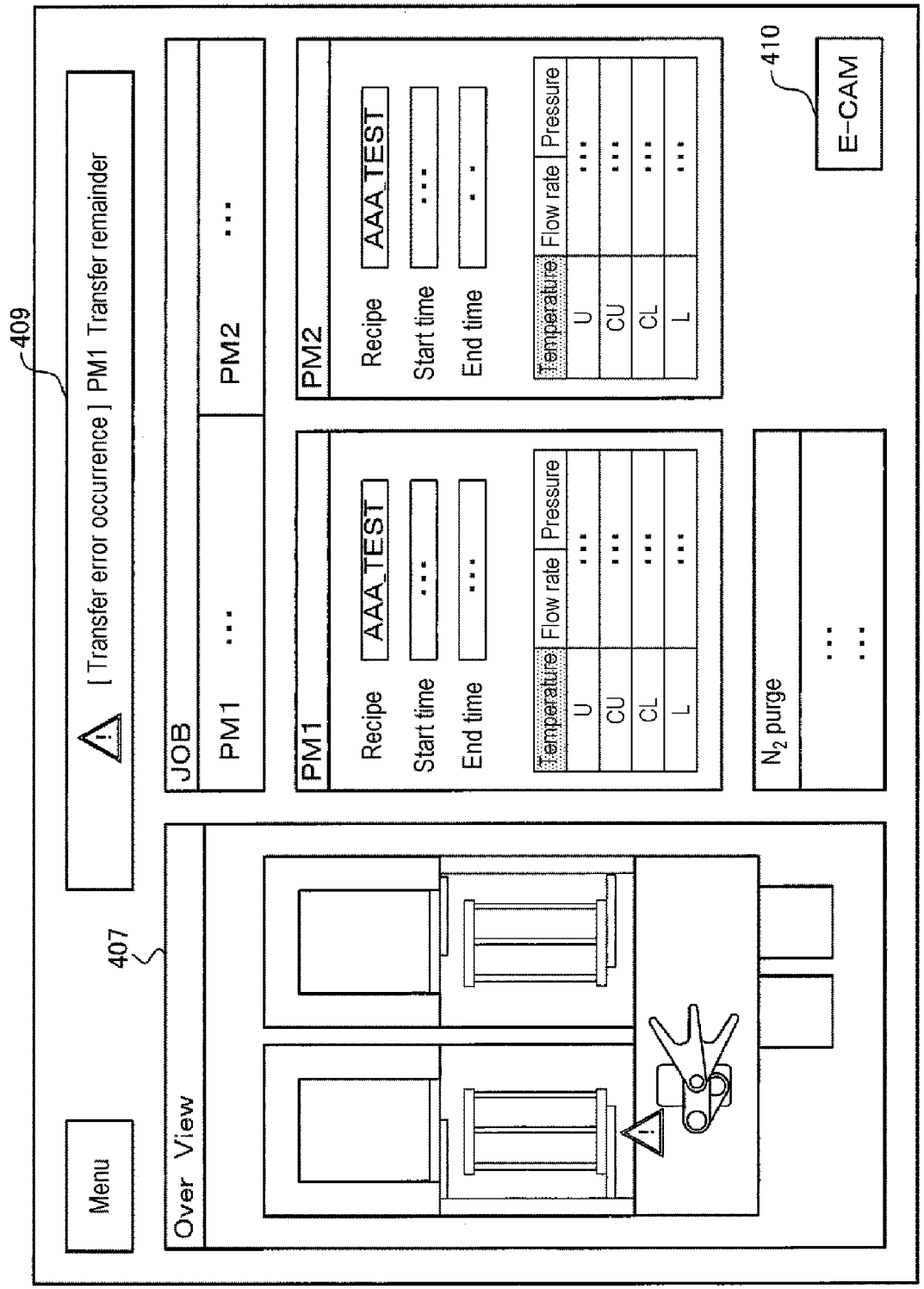
FIG. 19 is an illustrative example of an operation screen of an apparatus controller suitably used in some embodiments of the present disclosure.
Figure 20:
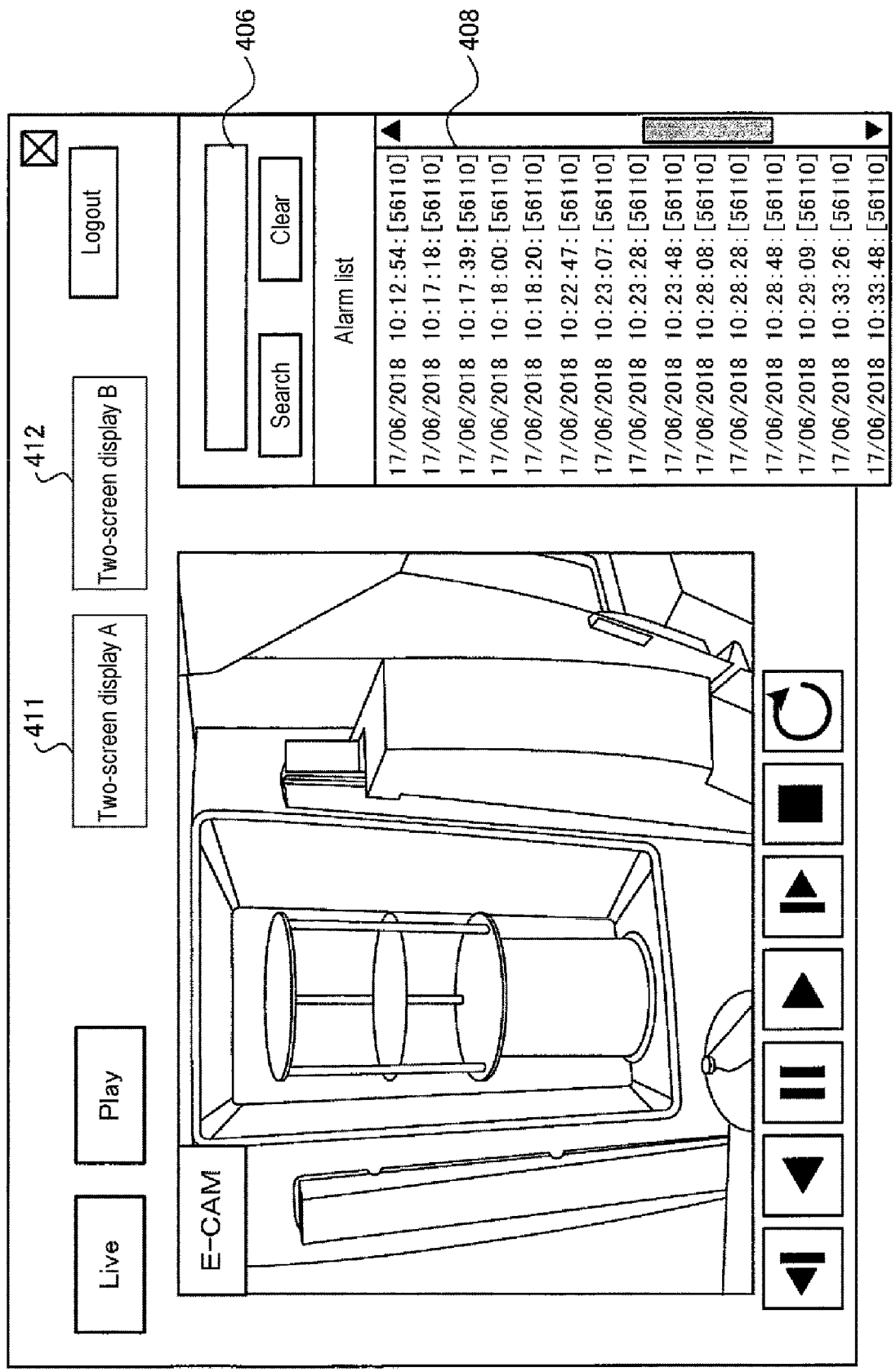
FIG. 20 is an illustrative example of alarm ID search screen display suitably used in some embodiments of the present disclosure.

Specifically, when the operation part PC 400 remotely connected to the monitoring controller 310 and configured to display the operation screen acquires an alarm notification, the same failure information screen as the operation part of the apparatus controller 210 is displayed on the operation screen as shown in FIG. 19. The failure information screen shown in FIG. 19 includes an overview display part 407 showing an overview of the apparatus, and a failure information display part 409 for displaying failure information such as a transfer error or the like. Depending on the display contents of the overview display part 407 and the failure information display part 409, it is possible to grasp the apparatus in which the transfer error has occurred, the location of the transfer error, the content of the transfer error, and the like. Furthermore, the failure information screen shown in FIG. 19 includes a means (E-CAM button) 410 for displaying the image data acquired by the cameras 91 to 95. Then, for example, when the E-CAM button 410 shown in FIG. 14 is pressed on the operation screen of the operation part PC 400, as shown in FIG. 20, a live image screen (event image data) of the transfer error obtained by the camera that has captured an image of a transfer error occurrence location is displayed. This live image screen is a still image available when the recording is ended together with the alarm notification. That is, for example, when the transfer remainder of the wafer W in the wafer discharging step is detected, it is possible to confirm the situation when the transfer remainder occurs. In addition, it is possible to rewind the recorded image on the operation screen shown in FIG. 20, play back the recorded image by a playback button, and perform frame-by-frame playback by a frame-by-frame playback button.

Furthermore, in FIG. 20, there are shown a search cell 406 for searching for an alarm ID and an alarm list 408. The alarm list 408 includes at least the date and time of occurrence of a transfer and the alarm ID. When an alarm ID or a transfer error occurrence time is selected from the alarm list 408, the second memory part 313b of the corresponding camera is searched from the selected alarm ID and the time stamp. The motion image (alarm image data) acquired for several tens of seconds before and after the occurrence of a transfer error, which has higher definition than the live image screen (event image data), is displayed. The details of the alarm event occurrence situation can be confirmed with reference to high-definition alarm image data.

Figure 21:
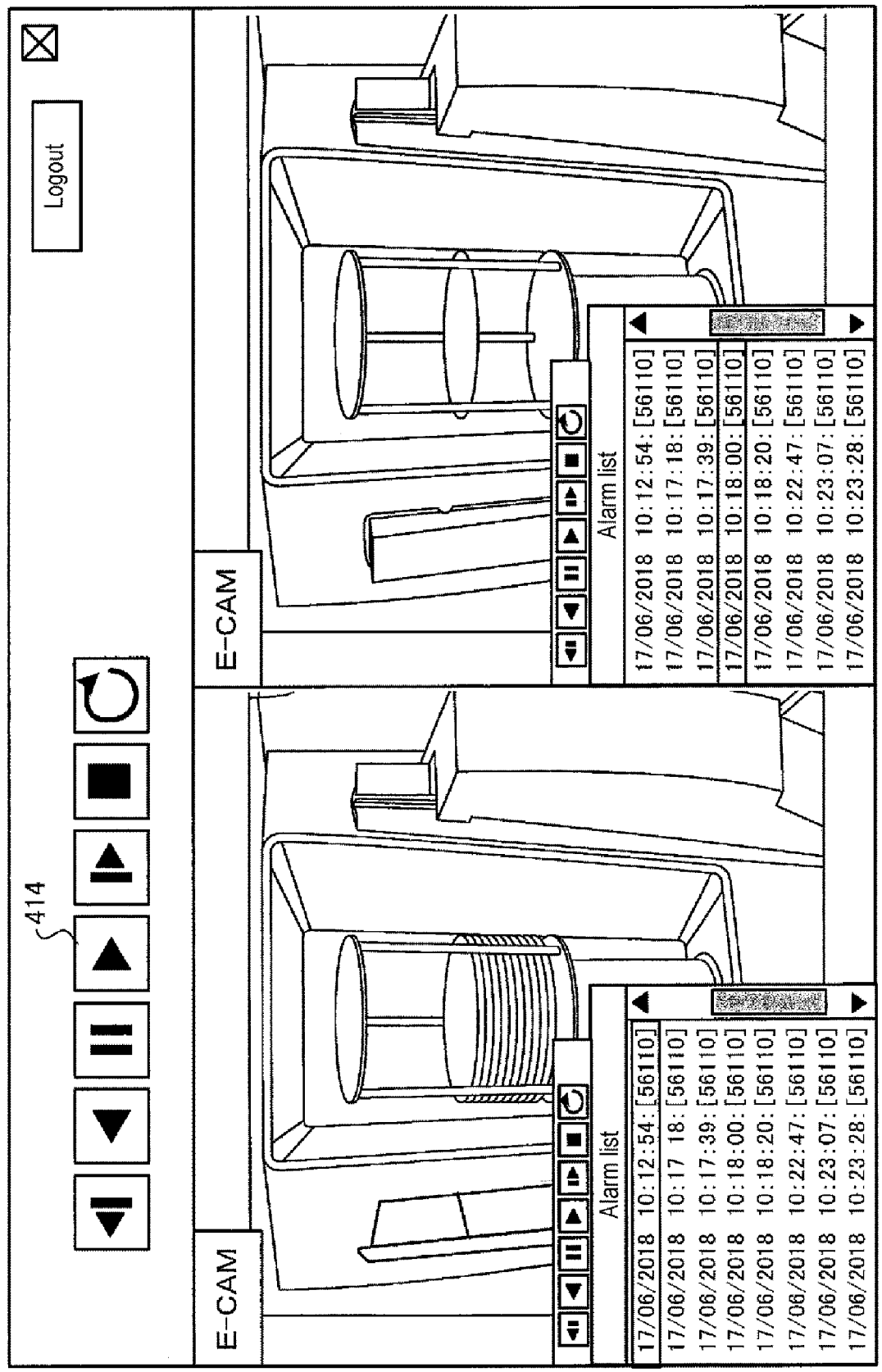
FIG. 21 is an illustrative example of comparison screen display suitably used in some embodiments of the present disclosure.

Furthermore, as shown in FIG. 20, the transfer error occurrence screen is provided with a two-screen display A button 411 and a two-screen display B button 412 which are comparison reference buttons. Then, when the two-screen display A button 411 is pressed, two screens for comparison and reference are displayed as shown in FIG. 21. That is, a list is displayed on the operation screen so that the file of low-compression/high-definition alarm image data can be selected. A desired file can be selected and displayed in comparison with other low-compression/high-definition alarm image data of the same day. In addition, the desired file can be displayed in comparison with the alarm image data of a transfer error which has the same alarm ID but occurs at a different date and time. This makes it possible to analyze whether the cause of the transfer error is the same factor or another factor.

Figure 22:
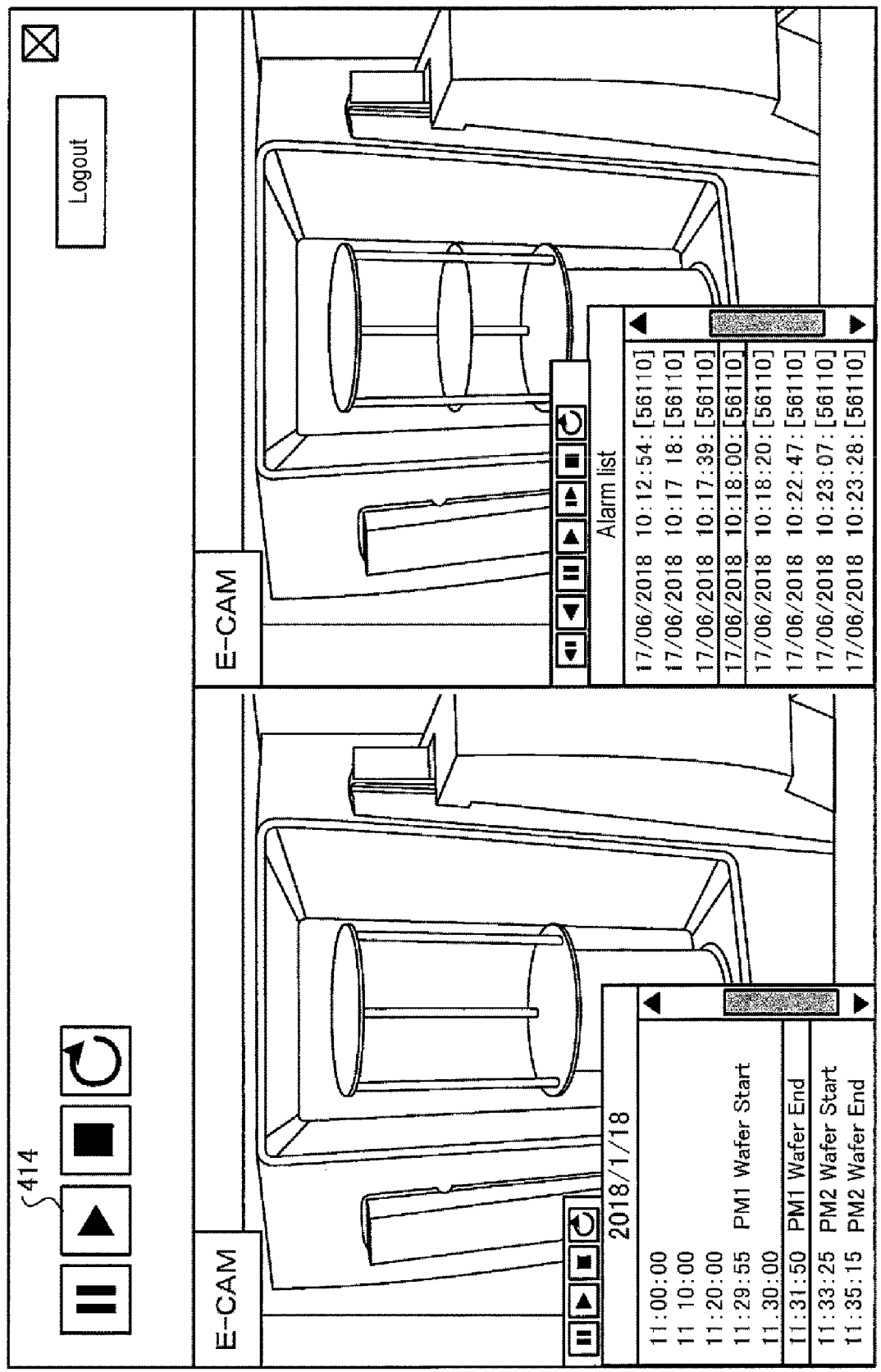
FIG. 22 is an illustrative example of comparison screen display suitably used in some embodiments of the present disclosure.

Furthermore, the two-screen display B button 412 is pressed on the transfer error occurrence screen as shown in FIG. 20, whereby a normal operation in the same transfer event an abnormal operation at the time of occurrence of a transfer error can be displayed for comparison on two screens as shown in FIG. 22.

Specifically, the event image data to be played back simultaneously with the transfer error occurrence screen on the right side is selected with reference to the event label display of an event recording file. Then, the two-screen simultaneous playback button 414 is pressed to synchronously play back the motion image of the normal-time high-compression event image data on the left side and the motion image of the low-compression/high-definition alarm image data on the right side. When images are not aligned at the time of synchronous playback, adjustment is performed using the illustrated motion image operation button. That is, by displaying the abnormal operation at the time of occurrence of a transfer error in comparison with the normal operation, it is possible to analyze what is different from the normal operation.

Furthermore, on the transfer error occurrence screen shown in FIG. 20, the target alarm motion image is selected from the displayed alarm list 408, and the two-screen display B button 412 is pressed. Then, the database 311a is searched from the playback start time stamp (time stamp of alarm occurrence time −20 seconds) of the selected alarm motion image and the target camera name, and the file of the first image data (event image data) is taken out from the first memory part 313a. The first image data is automatically cued and displayed on the left side with a playback start time stamp. The operator can operate the first image data on the left side to confirm the motion images acquired until a transfer error occurs. In addition, the motion images acquired until a transfer error occurs can be selected and played back with reference the event label display.

As a result, the motion images as the event image data acquired until a transfer error occurs and the motion images as the alarm image data acquired before and after a transfer error occurs (for 20 seconds before alarm occurrence and 20 seconds after alarm generation: 40 seconds in total) can be displayed on the screen.

According to the embodiments, data is compressed in a normal operation because the event image data is stored as the motion image of a H.264 format. On the other hand, if there is a portion that differs between frames, specifically a portion that does not move during a normal transfer but moves just before occurrence of a transfer error, recording can be performed without any missing portion. This makes it possible to confirm the transition of event image data until a transfer error occurs.

In addition, when displaying the motion image or the still image captured by the cameras, not only the image of the transfer means as an imaging target but also the image of the surrounding environment are captured together. As a result, even if the error is not directly attributable to the transfer means but is caused by the parts existing around the transfer means as an imaging target, an error factor can be identified by analyzing the images if it fall within an imaging range of a camera (if it is displayed in event image data or alarm image data).

Then, the person in charge of the apparatus frequently checks the motion image and the still image displayed on the display portion of the operation part and performs alarm recording analysis, whereby a transfer error occurrence situation can be grasped to find a restoration method and a restoration instruction can be issued by a telephone, a mail or the like. Thereafter, the operator carries out an apparatus restoration work according to the instruction. The operation part may be disposed at a position spaced apart from the factory where the substrate processing apparatus 4 is disposed. In this case, the person in charge of the apparatus instructs an operator or an apparatus engineer in a clean room to take measures for apparatus restoration. The operator or the apparatus engineer carries out an apparatus restoration work according to the instruction.

(Carrier Unloading Step: S17)

Then, if the error is eliminated by the restoration process in the wafer discharging step, the next carrier unloading step is started through the operation opposite to the operation in the carrier loading step. When receiving a start event, the monitoring controller 310 causes the camera 91 to start recording of event image data. When receiving an end event, the monitoring controller 310 causes the camera 91 to terminate the recording of event image data. The monitoring controller 310 is configured to store the event image data acquired by the camera 91 in the first memory part 313*a* and to update the event recording information list during the carrier unloading step.

According to the embodiments, at least one or more of the following effects (a) to (d) may be achieved.

(a) According to the embodiments, while acquiring image data during substrate transfer, high-definition image data is acquired at the time of occurrence of a transfer error separately from the image data acquired during substrate transfer. The respective image data can be used at the time of analyzing the transfer error. This makes it possible to perform the analysis of a transfer error (the failure analysis).

(b) According to the embodiments, an event signal is notified from a sensor provided on each transfer mechanism such as a transfer robot or the like not only to the apparatus controller 210 but also to the operation part PC 400 at each event indicating a wafer transfer start timing or the like. Thus, the operation part PC 400 determines whether the event information corresponds to a camera installation location at the event end timing, performs cueing at the event occurrence time of the event recording file stored in the memory part. Thus, the normal operation can be confirmed, and the motion images (event image data) of plural pieces of event information can be compared and displayed at the same time.

(c) According to the embodiments, when the corresponding event information is selected from the event recording information list of the monitoring controller 310, the motion image (event image data) acquired by the camera is played back from the event occurrence time. As described above, according to the present configuration in which the cameras 91 to 95 are provided for each event, the recording is performed only while the apparatus is in operation (or while each transfer means for transferring the wafer W is moving). Thus, the time period for recording with the camera can be extended as compared with the case of constant recording.

(d) In the embodiments, the event recording information file and the alarm recording file can be selected and displayed on the same operation screen. Therefore, it is possible to pursue the cause of the transfer error (failure).

The present disclosure is not limited to the above embodiments. It goes without saying that various modifications may be made without departing from the scope of the present disclosure.

(Other Embodiments)

For example, according to the above-described embodiments, the data acquisition cycle is 30 frames per second. The second image data is stored as it is in the second memory part 313*b*. In the case of the first image data, the image data acquired before the frame and the image data acquired after the frame are compared with each other. Depending on the presence or absence of a change in data, the image data is compressed and stored in the first memory part 313*a*. However, the present disclosure is not limited to the embodiments.

Example 1

The data acquisition cycle is 30 frames per second as in the above-described embodiments. However, the first image data and the second image data have different resolutions. For example, even if the first image data is 1600×900 pixels and the second image data is 3840×2160 (4K) pixels, the same effects as those of the embodiments can be obtained. In addition, by using the multi-stream function of simultaneously transmitting the first image data and the second image data, it can be implemented with one camera.

Example 2

The data acquisition cycle may be changed between the first image data and the second image data. For example, the first image data may be 3 frames per second, and the second image data may be 30 seconds per second as in the embodiments. As a result, the first image data may be reduced in data amount to one-tenth of the second image data. In addition, since the handling of the second image data is the same as that of the embodiments, it is possible to obtain the same effects as those of the embodiments.

In the embodiments of the present disclosure, there has been described the case of processing the wafer. However, the present disclosure may be applied to general substrate processing apparatuses that process a glass substrate of a liquid crystal panel or a substrate such as a magnetic disk or an optical disk.

According to the present disclosure in some embodiments, it is possible to perform an analysis of abnormality of a transfer error using image data obtained at the time of substrate transfer and image data obtained at the time of transfer error occurrence.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
a first controller configured to acquire event data generated at a time of transferring a substrate and alarm data generated at a time of occurrence of a transfer error;
a recorder configured to, while recording a transfer operation of the substrate as first image data, record the transfer operation of the substrate as second image data having a higher resolution than the first image data;
a second controller configured to store the first image data recorded by the recorder in a first memory based on the event data, and store the second image data recorded by the recorder in a second memory based on the alarm data; and
an operating controller configured to display at least the first image data and the second image data,
wherein the second controller is configured to display both the first image data and the second image data recorded at the time of occurrence of the transfer error on a same screen.

2. The system of claim 1, further comprising:
a transfer device configured to transfer the substrate; and
a detector configured to detect the transfer error generated by the transfer device,
wherein the first controller is configured to acquire a notification indicative of the transfer error from the detector and to notify error information, which includes at least a name of an apparatus in which the transfer error has occurred, an alarm ID set for the transfer error, and an occurrence time of the transfer error, to the second controller and the operating controller.

3. The system of claim 2, wherein the second controller is configured to acquire the error information, convert the second image data acquired for a predetermined time before and after the occurrence of the transfer error into a file, store the file in the second memory, cause the operating controller to, based on the error information, display a same screen as an operation screen of the apparatus in which the transfer error has occurred, and cause the same screen to display a device configured to receive an instruction to display the first image data acquired by the recorder.

4. The system of claim 2, wherein the second controller is configured to, when receiving an instruction to display the first image data acquired by the recorder, perform switching to a screen including the first image data at the time of occurrence of the transfer error and the error information, and display the switched screen on the operating controller.

5. The system of claim 2, wherein the second controller is configured to, when receiving an instruction to select the alarm ID and/or the transfer error occurrence time, cause the operating controller to display the second image data obtained by searching an inside of the second memory using the selected alarm ID and/or the transfer error occurrence time.

6. The system of claim 1, wherein the detector is configured to detect event data indicative of start and end of transfer of the substrate by the transfer device,
wherein the first controller is configured to notify the second controller of the event data when the event data is detected by the detector, and
wherein the second controller is configured to, when notified of event data indicative of the end of the transfer operation of the substrate, cause the first memory to store the first image data recorded from start to end of the transfer operation of the substrate.

7. The system of claim 2, wherein the second controller is configured to cause the same screen to display the second image data obtained by searching the inside of the second memory using the selected alarm ID and/or the transfer error occurrence and the first image data recorded from start to end of the transfer operation of the substrate stored in advance in the first memory.

8. The system of claim 1, further comprising:
a plurality of transfer mechanisms configured to transfer the substrate; and
a detector provided in each of the transfer mechanisms and configured to detect the transfer error caused by each of the transfer mechanisms,
wherein the recorder is configured to capture an image of the transfer operation of the substrate by each of the transfer mechanisms to be recorded, and
the second controller is configured to cause the recorder to, while recording a motion image of the substrate transfer by each of the transfer mechanisms as the first image data, record a motion image of the substrate transfer by each of the transfer mechanisms as the second image data having a higher resolution than the first image data.

9. The system of claim 8, wherein the second controller is configured to cause the recorder to record the first image data and the second image data when each of the transfer mechanisms to be recorded is transferring the substrate or a carrier containing the substrate.

10. The system of claim 8, wherein the second controller is configured to cause the recorder not to record the first image data and the second image data when each of the transfer mechanisms to be recorded is stopped.

11. The system of claim 2, wherein the second controller is configured to be able to specify one of the transfer mechanisms that has caused the transfer error according to the number of the alarm ID acquired when the transfer error occurs.

12. The system of claim 11, wherein the second controller is configured to obtain only the second image data of the recorder for recording the specified one of the transfer mechanisms.

13. The system of claim 8, wherein each of the transfer mechanisms is at least one selected from the group consisting of a load port, a pod transfer device, a boat and a transfer machine.

14. A substrate processing apparatus, comprising:
a first controller configured to acquire event data generated at a time of transferring a substrate and alarm data generated at a time of occurrence of a transfer error;
a recorder configured to, while recording a transfer operation of the substrate as first image data, record the transfer operation of the substrate as second image data having a higher resolution than the first image data;
a second controller configured to store the first image data recorded by the recorder in a first memory based on the event data, and store the second image data recorded by the recorder in a second memory based on the alarm data; and
an operating controller configured to display at least the first image data and the second image data,
wherein the second controller is configured to cause the same screen to display both the first image data and the second image data recorded at the time of occurrence of the transfer error.

* * * * *